US005699305A

United States Patent [19]

Kawashima

[11] Patent Number: 5,699,305
[45] Date of Patent: Dec. 16, 1997

[54] AMPLIFIER AND SEMICONDUCTOR MEMORY DEVICE HAVING THE SAME

[75] Inventor: Shoichiro Kawashima, Kawasaki, Japan

[73] Assignee: Fujitsu Limited, Kawasaki, Japan

[21] Appl. No.: 677,364

[22] Filed: Jul. 5, 1996

[30] Foreign Application Priority Data

Sep. 6, 1995 [JP] Japan .................... 7-228753

[51] Int. Cl.$^6$ ................ G11C 7/00; G11C 7/02
[52] U.S. Cl. ............ 365/190; 365/205; 365/207; 365/208; 327/51
[58] Field of Search ................. 365/190, 205, 365/207, 208; 327/51

[56] References Cited

U.S. PATENT DOCUMENTS

| 4,542,483 | 9/1985 | Procyk | 365/205 |
|---|---|---|---|
| 4,551,641 | 11/1985 | Pelley, III | 365/205 |
| 4,816,706 | 3/1989 | Dhong et al. | 365/205 |
| 5,017,815 | 5/1991 | Shah et al. | 365/205 |
| 5,023,841 | 6/1991 | Akrout et al. | 365/205 |
| 5,216,634 | 6/1993 | Takano et al. | 365/205 |
| 5,410,197 | 4/1995 | Krenik | 365/205 |
| 5,467,312 | 11/1995 | Albon et al. | 365/205 |

OTHER PUBLICATIONS

Leo C. M. G. Pfennings, et al., "Differential Split-Level CMOS Logic for Subnanosecond Speeds", IEEE Journal of Solid-State Circuits, vol. sc–20, No. 5, Oct. 1985, pp. 1050–1055.

Primary Examiner—David C. Nelms
Assistant Examiner—Trong Quang Phan
Attorney, Agent, or Firm—Armstrong, Westerman, Hattori, McLeland & Naughton

[57] ABSTRACT

A amplifier coupled to first and second power supply lines includes a first pair of cross-coupled transistors connected to the first power supply line and a pair of output terminals, and a second pair of cross-coupled transistors connected to the second power supply line. The amplifier includes a reset circuit which is provided between the first and second pairs of cross-coupled transistors and shortcircuits the pair of output terminals in response to a pair of predetermined control signals. The amplifier includes a pair of input transistors connected to the second pair of cross-coupled transistors, and a pair of non-linear elements which are provided between the first and second pairs of cross-coupled transistors.

20 Claims, 22 Drawing Sheets 5,699,305

1

AMPLIFIER AND SEMICONDUCTOR MEMORY DEVICE HAVING THE SAME

BACKGROUND OF THE INVENTION

1. Field of the Invention

The present invention generally relates to amplifiers used in semiconductor memory devices, and more particularly to a latch-type amplifier which amplifies the difference between the potentials of input signals. An example of such a latch-type amplifier is a latch-type sense amplifier used in an SRAM (Static Random Access Memory) device.

2. Description of the Related Art

FIG. 1 is a circuit diagram of an SRAM. As shown in FIG. 1, the SRAM device includes memory cells 1–9, word lines WL0, WL1, ..., Wn for selecting the cells, and bit lines BL0, /BL0, BL1, /BL1, ..., BLm, /BLm used to transfer data. The symbol "/" indicates the complementary relationship with the signal indicated by the symbol having no slash, and n and m are arbitrary numbers. The SRAM device further includes a VCC power supply line 10 which supplies a power supply voltage VCC, and bit line load circuits 11–13 which function as loads of the bit lines. The bit line load circuits 11–13 respectively include pairs of nMOS (n-channel Metal Oxide Semiconductor) transistors 14 and 15, 16 and 17, and 18 and 19. The SRAM device shown in FIG. 1 includes column gates 20–22, which are supplied with column selecting signals CL0, CL1 and CLm generated by a column decoder (not shown). The column gates 20–22 respectively include pairs of nMOS transistors 23 and 24, 25 and 26, and 27 and 28.

The SRAM device includes a latch-type sense amplifier 29, and data lines which carry output signals out and /out from the sense amplifier 29. The sense amplifier 29 receives input signals in and /in, which are the potentials of the bit lines BLi and /BLi selected at the time of reading data, and amplifiers the difference between the potentials of the selected bit lines BLi and /BLi (between the potentials of the input signals in and /in).

FIG. 2 is a circuit diagram of the cell 1 shown in FIG. 1. The other cells 2–9 shown in FIG. 1 are configured in the same way as the cell 1. The cell 1 includes a flip-flop circuit 33, which is connected to a VCC power supply line 34 and a VSS ground line 35 which supplies a ground potential VSS. The flip-flop circuit 33 includes nMOS transistors 36 and 37 functioning as driving elements, and pMOS transistors 38 and 39 functioning as load elements. The flip-flop circuit 33 is connected to the bit line BL0 through an nMOS transistor 40, and is connected to the bit line /BL0 through an nMOS transistor 41. The transistors 40 and 41 are turned ON and OFF, and function as transfer gates.

FIG. 3 is a circuit diagram of the sense amplifier 29 shown in FIG. 1. The sense amplifier 29 is connected to a VCC power supply line 43 via a pMOS transistor 49, and is connected to a VSS ground supply line 44 via an nMOS transistor 50. A sense amplifier activating signal az is applied to the pMOS transistor 49, and a sense amplifier activating signal ax, which has the complementary relationship with the signal az, is applied to the nMOS transistor 50. The sense amplifier 29 includes pMOS transistors 45 and 46, which are cross-coupled to form a flip-flop circuit. The sense amplifier 29 includes nMOS transistors 47 and 48, which are cross-coupled to form a flip-flop circuit.

Further, the sense amplifier 29 includes an nMOS transistor 51, which is turned ON and OFF in response to a reset control signal cx. The sense amplifier 29 includes a pMOS

2 transistor 52, which is turned ON and OFF in response to a reset signal cz having the complementary relationship with the reset control signal cx. Furthermore, the sense amplifier 29 includes CMOS transfer gates 53 and 54, which are turned ON and OFF in response to transfer control signals tx and tz having the complementary relationship.

FIG. 4 is a waveform diagram of the operation of the sense amplifier 29 shown in FIG. 3. At the time of resetting of the sense amplifier 29 (reset mode), the sense amplifier activating signals az and ax are respectively set equal to VCC and VSS, and the reset control signals cx and cz are respectively set equal to VCC and VSS. Hence, the pMOS transistor 49 is turned OFF, and the nMOS transistor 50 is turned OFF. Thus, the sources of the pMOS transistors 45 and 46 and the sources of the nMOS transistors 47 and 48 are in the electrically floating state, so that the sense amplifier 29 is in the inactive state.

When the nMOS transistor 51 is turned ON and the pMOS transistor 52 is turned ON, output nodes na and nb are shortcircuited so that the sense amplifier 29 is in the reset state in which the data lines 30 and 31 are at an identical potential. Thereafter, the reset control signals cx and cz are respectively switched to VSS and VCC, and thus the nMOS transistor 51 and the pMOS transistor 52 are both turned OFF. Hence, the output nodes na and nb are released from the shortcircuited state, and therefore the reset state. At this time, the transfer control signals tx and tz are respectively set to VCC and VSS. Hence, the CMOS transfer gates 53 and 54 are both turned ON, and a slight potential difference between the output nodes na and nb is made.

Thereafter, the sense amplifier activating signals az and ax are respectively switched to VSS and VCC. Thus, the pMOS transistor 49 is turned ON, and the nMOS transistor 50 is turned ON. Then, the potential difference between the input signals in and /in is amplified by the flip-flop operation of the pMOS transistors 45 and 46 and the nMOS transistors 47 and 48. As a result, the output signals out and /out having a large potential difference are output and then latched. Simultaneously, the transfer control signals tx and tz are respectively switched to VSS and VCC, and thus the CMOS transfer gates 53 and 54 are both turned OFF. Hence, it is possible to prevent a current from flowing on the input side in the reverse direction.

FIG. 5 is a circuit diagram of another configuration of the sense amplifier 29. The configuration shown in FIG. 5 includes pMOS transistors 56–59 and nMOS transistors 60–62. A clock signal clk is applied to the gates of the transistors 58, 59 and 62.

FIG. 6 is a waveform diagram of the operation of the sense amplifier shown in FIG. 5. When the clock signal clk is switched to VSS, the pMOS transistors 58 and 59 are turned ON and the nMOS transistor 62 is turned OFF. Hence, the data lines 30 and 31 are reset to a potential equal to VCC/2. When the clock signal clk is switched to VCC, the pMOS transistors 58 and 59 are turned OFF and the nMOS transistor 62 is turned ON.

If the potential of the input signal in is higher than that of the input signal /in, the nMOS transistor 60 performs the pull-down operation stronger than that performed by the nMOS transistor 61. Thus, the data line 31 is discharged via the nMOS transistors 60 and 62, so that the potential of the data line is decreased. Hence, due to the flip-flop operation of the pMOS transistors 56 and 57, a charge is supplied to the data line 30 through the pMOS transistor 57. Finally, the output signal out becomes equal to VCC−α, and the output signal /out becomes equal to VSS+α.

Then, if the potential of the input signal in becomes lower than the input signal /in in the next access, the potential of the output signal out becomes lower than the power supply voltage VCC, and the potential of the output signal /out becomes higher than the ground voltage VSS. Hence, the potential difference between the output signals out and /out is reduced.

The sense amplifier having the configuration shown in FIG. 3 needs many control signals, which are the sense amplifier activating signals ax and az, the reset control signals cx and cz and transfer control signals tx and tz. Further, it is necessary to provide sufficient timing margins among the control signals in order to ensure the certain operation. However, this prevents speeding up of the operation.

The sense amplifier having the configuration shown in FIG. 5 takes a long time to reset the sense amplifier. This is because the data lines 30 and 31 are reset at the time of resetting the sense amplifier by the pMOS transistors 58 and 59, but are not shortcircuited. This problem prevents speeding up of the operation.

SUMMARY OF THE INVENTION

It is a general object of the present invention to provide a latch-type amplifier in which the above disadvantages are eliminated.

A more specific object of the present invention is to provide a latch-type amplifier capable of amplifying the difference between the potentials of input signals and latching it at a higher speed.

The above objects of the present invention are achieved by an amplifier coupled to first and second power supply lines, the amplifier comprising: a first pair of cross-coupled transistors having sources commonly connected to the first power supply line and drains respectively connected to a pair of output terminals; a second pair of cross-coupled transistors having sources commonly connected to the second power supply line and drains respectively receiving a pair of input signals; a reset circuit provided between the pair of output terminals and shortcircuits the pair of output terminals in response to a pair of predetermined control signals; and a pair of non-linear elements which are provided between the first and second pairs of cross-coupled transistors.

The the pair of non-linear elements may be respectively nMOS transistors which have current terminals connecting the first and second pairs of cross-coupled transistors and gates connected to the first power supply line.

The amplifier may comprise: a first transistor which disconnects the sources of the first pair of cross-coupled transistors from the first power supply line in response to a first activating signal; and a second transistor which disconnects the sources of the second pair of cross-coupled transistors from the second power supply line in response to a second activating signal.

The amplifier may further comprise: a pair of input transistors having drains coupled to the drains of the second pair of cross-coupled transistors, sources coupled to the second power supply lines, and gates receiving the pair of input signals; a third transistor which is provided between one of the pair of input transistors and the second power supply line and is controlled in response to a first input control signal; and a fourth transistor which is provided between the other one of the pair of input transistors and the second power supply line and is controlled in response to a second input control signal.

The third and fourth transistors may be respectively nMOS transistors.

The above amplifier may be configured as follows. The first pair of cross-coupled transistors are respectively pMOS transistors. The second pair of cross-coupled transistors are respectively nMOS transistors. The pair of input transistors are respectively nMOS transistors.

In this case, the pair of non-linear elements may be located between the reset circuit and the second pair of cross-coupled transistors.

The above objects of the present invention are also achieved by an amplifier coupled to first and second power supply lines, the amplifier comprising: a first pair of cross-coupled transistors having sources commonly connected to the first power supply line and drains respectively receiving a pair of input signals; a second pair of cross-coupled transistors having sources connected to the second power supply line and drains respectively connected to a pair of output terminals; a reset circuit provided between the pair of output terminals and shortcircuits the pair of output terminals in response to a pair of predetermined control signals; and a pair of non-linear elements which are provided between the first and second pairs of cross-coupled transistors.

The pair of non-linear elements may be respectively pMOS transistors which have current terminals connecting the first and second pairs of cross-coupled transistors and gates are connected to the second power supply line.

The amplifier may further comprise: a first transistor which disconnects the sources of the first pair of cross-coupled transistors from the first power supply line in response to a first activating signal; and a second transistor which disconnects the the sources of the second pair of cross-coupled transistors from the second power supply line in response to a second activating signal.

The amplifier may further comprise: a pair of input transistors having sources connected to the first power supply line, drains connected to the drains of the first pair of cross-coupled transistors, and gates receiving the pair of input signals; a third transistor which is provided between the first power supply line and one of the pair of input transistors and is controlled in response to a first input control signal; and a fourth transistor which is provided between the first power supply line and the other one of the pair of input transistors and is controlled in response to a second input control signal.

The third and fourth transistors may be respectively pMOS transistors.

The amplifier may be configured as follows. The first pair of cross-coupled transistors are respectively pMOS transistors. The second pair of cross-coupled transistors are respectively nMOS transistors. The pair of input transistors are respectively pMOS transistors.

The aforementioned objects of the present invention are also achieved by an amplifier coupled to first and second power supply lines, the amplifier comprising: a first pair of cross-coupled transistors having sources commonly connected to the first power supply line and drains respectively receiving a pair of input signals; a second pair of cross-coupled transistors having sources commonly connected to the second power supply line and drains respectively receiving the pair of input signals; a reset circuit provided between a pair of output terminals and shortcircuits the pair of output terminals in response to a pair of predetermined control signals; a first pair of non-linear elements provided between the pair of output terminals and the first pair of cross-coupled transistors; a second pair of non-linear elements provided between the pair of output terminals and the second pair of cross-coupled transistors.

The first pair of non-linear elements may be pMOS transistors having current terminals connecting the drains of the first pair of cross-coupled transistors and the pair of output terminals, and gates connected to the second power supply line. The second pair of non-linear elements may be nMOS transistors having current terminals having current termianls connecting the drains of the second pair of cross-coupled transistors and the pair of output terminals, and gates connected to the first power supply line.

The amplifier may further comprise: a first transistor which disconnects the sources of the first pair of cross-coupled transistors from the first power supply line in response to a first activating signal; and a second transistor which disconnects the sources of the second pair of cross-coupled transistors from the second power supply line in response to a second activating signal.

The amplifier may further comprise: a first pair of input transistors having sources coupled to the first power supply line, drains connected to the drains of the first pair of cross-coupled transistors, and gates receiving the pair of input signals; a third transistor which is provided between the first power supply line and one of the first pair of input transistors and is controlled in response to a first input control signal; a fourth transistor which is provided between the first power supply line and the other one of the first pair of input transistors and is controlled in response to a second input control signal; a second pair of input transistors having drains connected to the drains of the second pair of cross-coupled transistors, sources coupled to the second power supply lines, and gates receiving the pair of input signals; a fifth transistor which is provided between one of the second pair of input transistors and the second power supply line and is controlled in response to the second input control signal; and a sixth transistor which is provided between the other one of the second pair of input transistors and the second power supply line and is controlled in response to the first input control signal.

It is another object of the present invention to provide a semiconductor memory device having a sense amplifier as configured above.

This object of the present invention is achieved by a semiconductor memory device comprising a plurality of cells, and a sense amplifier commonly connected to the plurality of cells and configured as described above.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
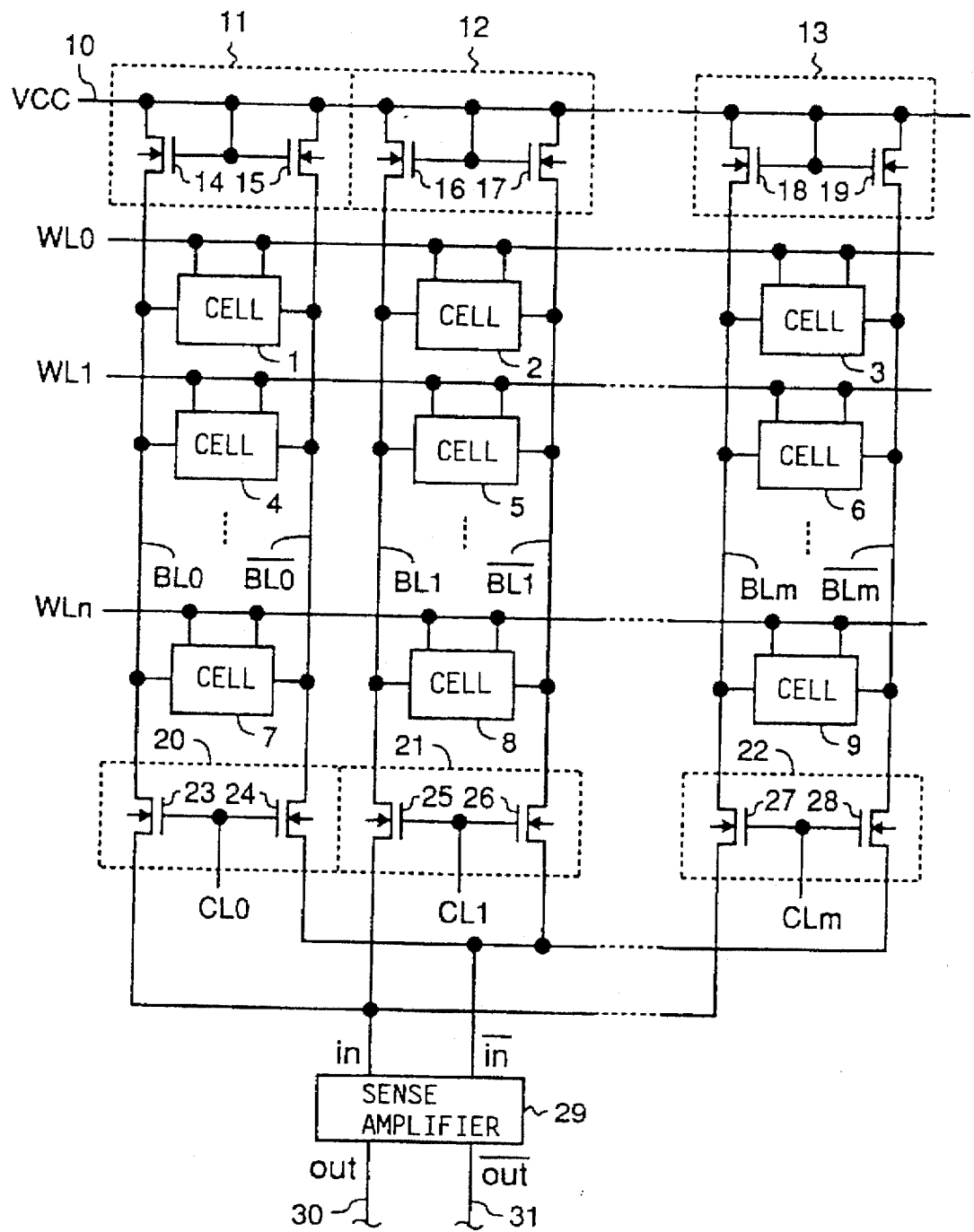
FIG. 1 is a circuit diagram of an SRAM device.
Figure 2:
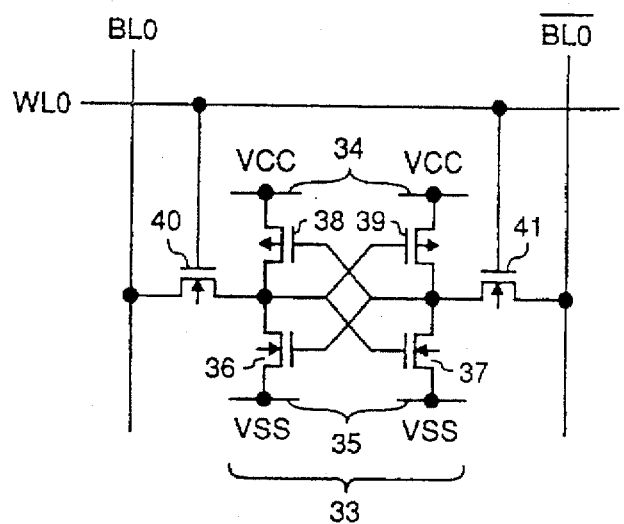
FIG. 2 is a circuit diagram of a cell used in the SRAM device shown in FIG. 1.
Figure 3:
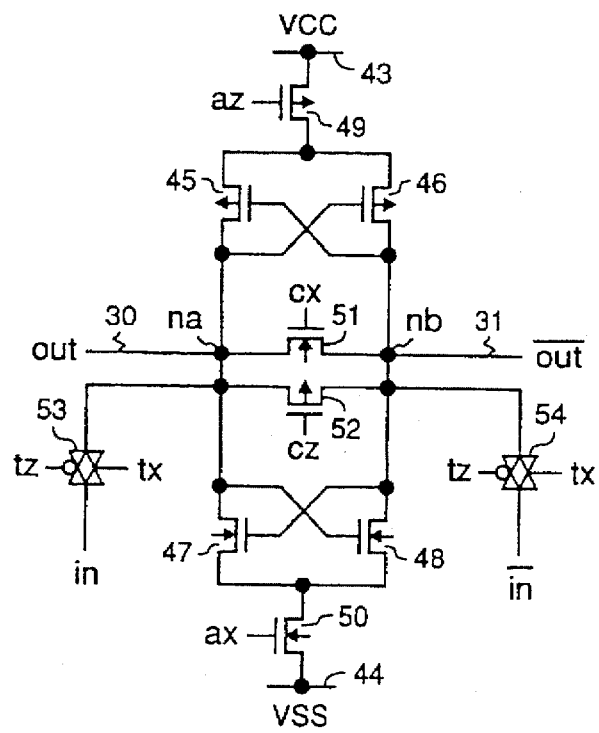
FIG. 3 is a circuit diagram of a configuration of a sense amplifier used in the SRAM device shown in FIG. 1.
Figure 4:
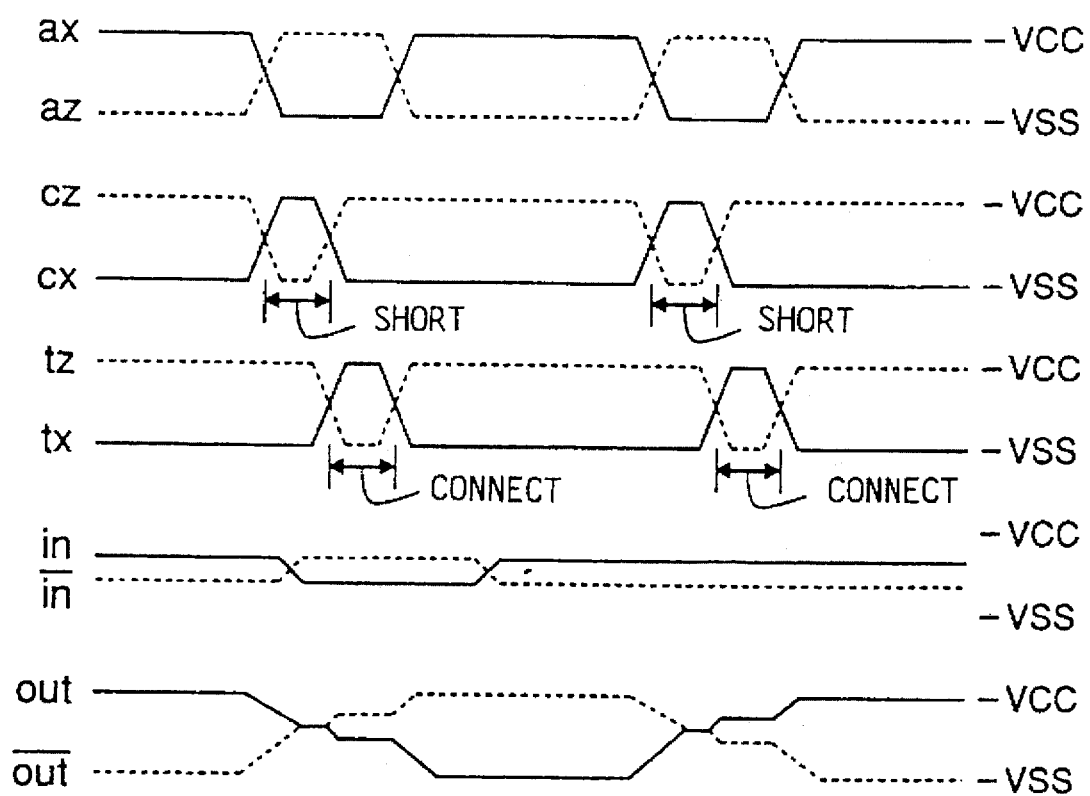
FIG. 4 is a waveform diagram of the operation of the sense amplifier shown in FIG. 3.
Figure 5:
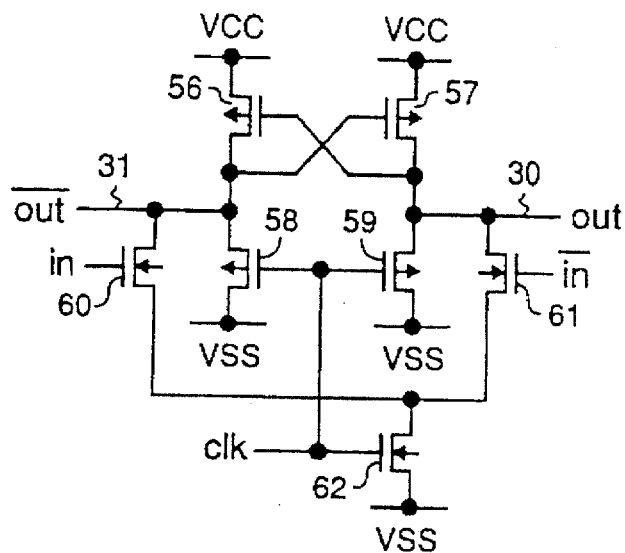
FIG. 5 is a circuit diagram of another configuration of the sense amplifier.
Figure 6:
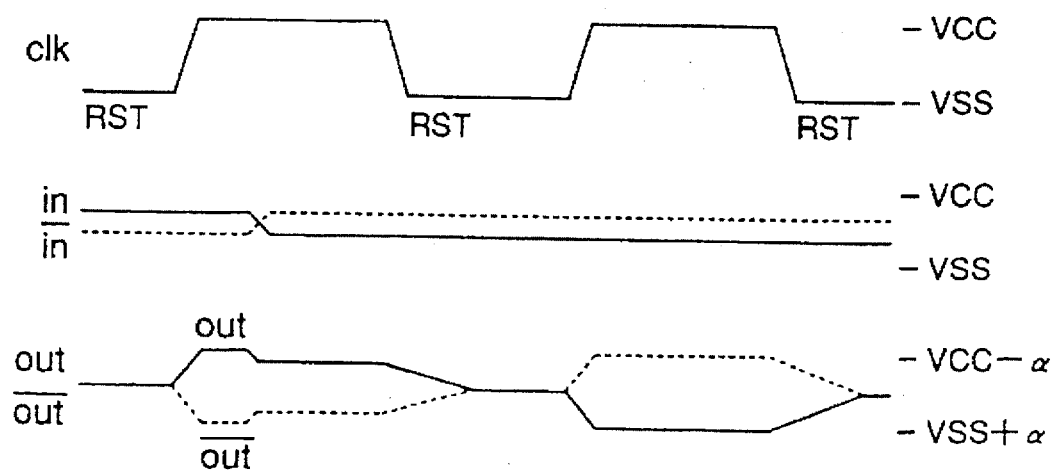
FIG. 6 is a waveform diagram of the operation of the sense amplifier shown in FIG. 5.
Figure 7:
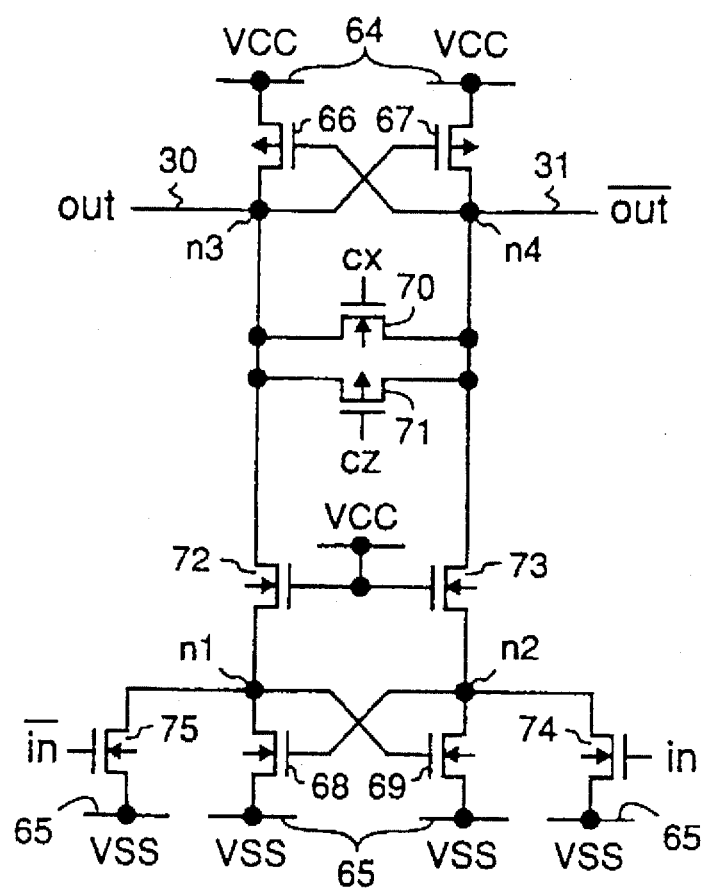
FIG. 7 is a circuit diagram of a latch-type amplifier according to a first embodiment of the present invention.

FIG. 7 is a circuit diagram of a latch-type amplifier according to a first embodiment of the present invention. The amplifier shown in FIG. 7 can be used as the sense amplifier 29 shown in FIG. 1.

The latch-type amplifier shown in FIG. 7 is connected to a VCC power supply line 64 which supplies the power supply voltage VCC, and a VSS ground line 65 which supplies the ground voltage VSS. The latch-type amplifier includes pMOS transistors 66 and 67, which form a flip-flop circuit. The sources of the pMOS transistors 66 and 67 are connected to the VCC power supply line 64. The gates of the pMOS transistors 66 and 67 are respectively connected to the drains of the pMOS transistors 67 and 66. That is, the pMOS transistors 66 and 67 are cross-coupled.

The latch-type amplifier shown in FIG. 7 includes nMOS transistors 68 and 69, which form a flip-flop circuit. The sources of the nMOS transistors 68 and 69 are connected to the VSS ground line 65. The gates of the nMOS transistors 68 and 69 are respectively connected to the drains of the nMOS transistors 69 and 68. That is, the nMOS transistors 68 and 69 are cross-coupled.

The latch-type amplifier shown in FIG. 7 includes an nMOS transistor 70, which is turned ON and OFF by the reset control signal cx. The drain of the nMOS transistor 70 is connected to a node n3 at which the drain of the pMOS transistor 66 is connected to the gate of the pMOS transistor 67. The source of the nMOS transistor 70 is connected to a node n4 at which the drain of the pMOS transistor 67 is connected to the gate of the pMOS transistor 66.

The latch-type amplifier shown in FIG. 7 includes a pMOS transistor 71, which is turned ON and OFF by the reset control signal cz having the complementary relationship with the reset control signal cx. The source of the pMOS transistor 71 is connected to the node n3, and the drain thereof is connected to the node n4.

The latch-type amplifier shown in FIG. 7 includes nMOS transistors 72 and 73 having gates to which a reference voltage such as the power supply voltage VCC is applied. The nMOS transistors 72 and 73 respectively function as non-linear current elements. The drain of the nMOS transistor 72 is connected to the node n3, and the source thereof is connected to the node n1 at which the drain of the nMOS transistor 68 is connected to the gate of the nMOS transistor 69. The drain of the nMOS transistor 73 is connected to the node n4, and the source thereof is connected to the node n2 at which the drain of the nMOS transistor 69 is connected to the gate of the nMOS transistor 68.

The latch-type amplifier shown in FIG. 7 includes an nMOS transistor (input transistor) 74 having a gate supplied with the input signal in. The drain of the nMOS transistor 74 is connected to the node n2, and the source thereof is connected to the VSS ground line 65. The latch-type amplifier shown in FIG. 7 includes an nMOS transistor (input transistor) 75 having a gate supplied with the input signal /in. The drain of the nMOS transistor 75 is connected to the node n1, and the source thereof is connected to the VSS ground line 65. The node n3 functions as an output terminal via which the output signal out is output. The node n4 function as another output terminal via which the output signal /out is output.

Figure 8:
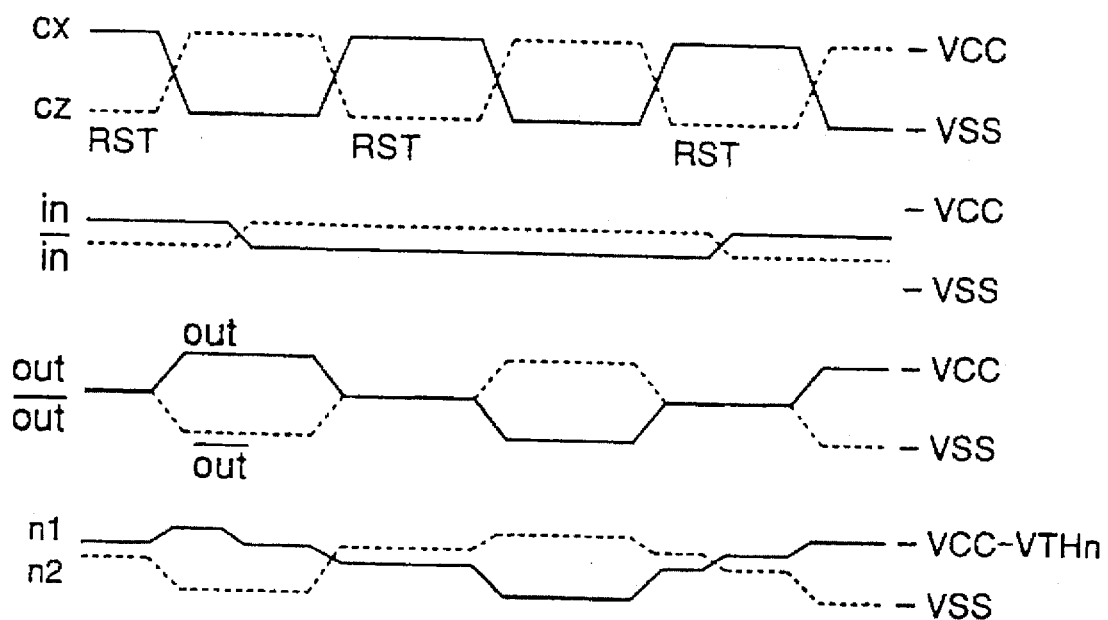
FIG. 8 is a waveform diagram of the operation of the amplifier shown in FIG. 7.

FIG. 8 is a waveform diagram of the operation of the latch-type amplifier shown in FIG. 7. At the time of resetting the amplifier, the reset control signals cx and cz are respectively set equal to VCC and VSS. Hence, the nMOS transistor 70 and the pMOS transistor 71 are both turned ON, and the output nodes n3 and n4 are shortcircuited. Hence, the potentials of the output nodes n3 and n4 are reset to VCC/2 rapidly. In this case, the nMOS transistors 72 and 73 function as source-follower circuits. The nodes n1 and n2 are reset to approximately VCC/2. When the potential of the input signal in is higher than that of the input signal /in, the current flowing in the nMOS transistor 74 is greater than that flowing in the nMOS transistor 75. Hence, a slight potential difference equal to, for example, 0.1 V–0.3 V is generated between the nodes n1 and n2. Hence, the potential of the node n1 becomes higher than that of the node n2.

That is, in the above case, the flip-flop circuit made up of the nMOS transistors 68 and 69 is in a state in which the flip-flop circuit is about to start the amplifying operation. However, the output nodes n3 and n4 are shortcircuited, and the pMOS transistors 66 and 67 are in the diode-connected state. In this state, the flip-flop circuit is not configured and the amplifying operation is not carried out.

Then, the reset control signals cx and cz are respectively set equal to VSS and VCC, and thus the nMOS transistor 70 and the pMOS transistor 71 are both turned OFF. As a result, the output nodes n3 and n4 are released from the shortcircuited state.

When the potential of the input signal in is higher than that of the input signal /in and the potential of the node n1 is higher than that of the node n2, the potential of the node n2 is decreased toward the ground voltage VSS due to the amplifying function of the flip-flop circuit made up of the nMOS transistors 68 and 69. Hence, the potential of the output node n4 is also decreased toward the ground voltage VSS, and the pull-up operation of the pMOS transistor 66 becomes stronger. Hence, the potential of the output node n3 is increased toward the power supply voltage VCC. Finally, the potentials of the output signals out and /out become equal to VCC and VSS, respectively. Further, the potential of the node n1 becomes equal to VCC–VTHn (VTHn denotes the threshold voltages of the nMOS transistors 72 and 73), and the potential of the node n2 becomes equal to VSS.

Since the potential of the output node n3 is equal to VCC and the potential of the output node n1 is equal to VCC–VTHn, the nMOS transistor 72 has a relatively large transfer resistance. Therefore, even if the potential of the input signal /in becomes higher than that of the input signal in in the next access, a pull-down current which pulls down the potential of the output node n3 is much smaller than an ON current flowing in the pMOS transistor 66 as its gate n4 is VSS. Hence, a potential drop at the node n1 is simply about 0.1 V, and does not affect the potential of the output node n3, that is, the potential of the output signal out.

In the above case, since the potential of the node n2 is equal to VSS, the nMOS transistor 73 is deeply ON. Hence, the state in which the potential of the node n4 is equal to VSS can be maintained even if the potential of the input signal /in becomes higher than that of the input signal in.

As described above, according to the first embodiment of the present invention, it is possible to amplify and latch the input signals in and /in without disconnecting the nMOS transistors 74 and 75 receiving the input signals in and /in from the nodes n2 and n1, respectively. Further, it is possible to reset the output nodes n3 and n4 without setting the sources of the transistors 66–69 to the electrically floating state. As a result, the latch-type amplifier according to the first embodiment of the present invention needs, as control signals necessary to perform the resetting, amplifying and latching operations, only the reset control signals cx and cz. Hence, it becomes possible to easily perform the control of the operation timing and accomplish speeding up of the operation of the amplifier.

Further, according to the first embodiment of the present invention, the output nodes n3 and n4 are reset by shortcircuiting the output nodes n3 and n4. Hence, it is possible to reduce the time necessary to reset the amplifier. This also contributes to speeding up the operation of the amplifier.

Figure 9:
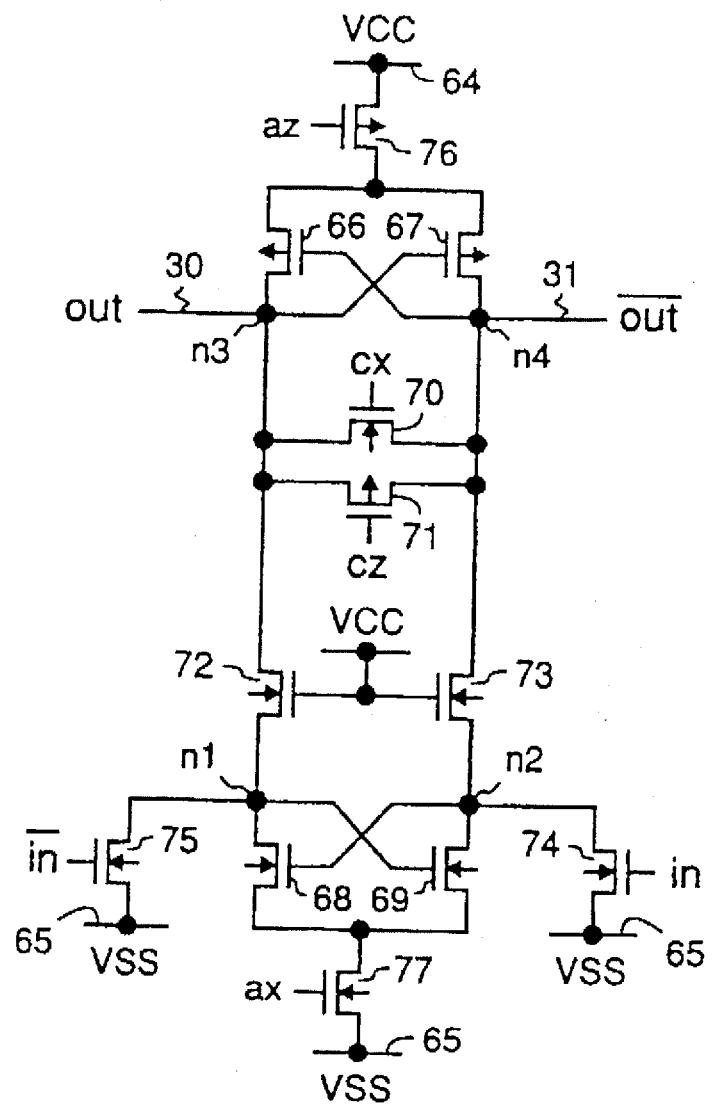
FIG. 9 is a circuit diagram of a latch-type amplifier according to a second embodiment of the present invention.

A description will now be given, with reference to FIGS. 9 and 10, of a latch-type amplifier according to a second embodiment of the present invention. As shown in FIG. 9, a pMOS transistor 76 and an nMOS transistor 77, which are respectively turned ON/OFF in response to the sense amplifier activating signals az and ax, are added to the configuration shown in FIG. 7 configured according to the first embodiment of the present invention. The sources of the pMOS transistors 66 and 67 are connected to the drain of the pMOS transistor 76, and the source of the pMOS transistor 76 is connected to the VCC power supply line 64. The sources of the nMOS transistors 68 and 69 are connected to the drain of the nMOS transistor 77, and the source of the nMOS transistor 77 is connected to the VSS ground line 65. The other parts of the configuration shown in FIG. 9 are the same as those of the configuration shown in FIG. 7.

Figure 10:
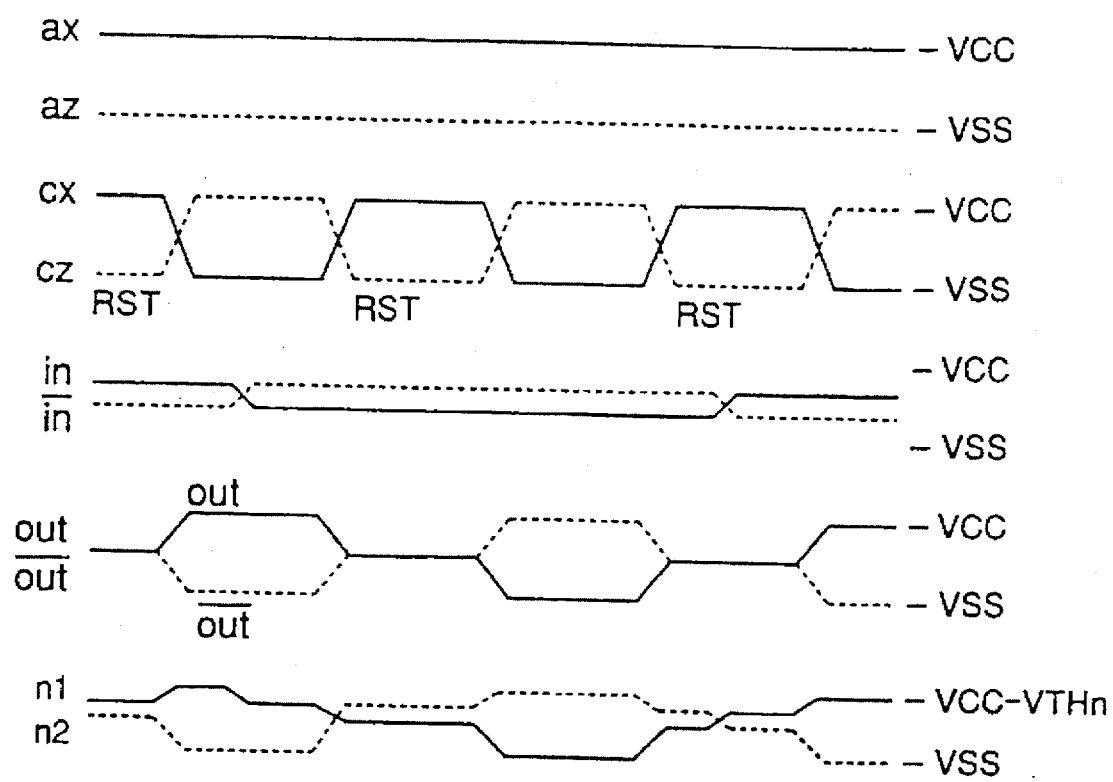
FIG. 10 is a waveform diagram of the operation of the amplifier shown in FIG. 9.

FIG. 10 is a waveform diagram of the operation of the amplifier shown in FIG. 9. In the active mode in which the amplifier is in the active state, the sense amplifier activating signals az and ax are respectively equal to VSS and VCC, and the transistors 76 and 77 are both ON.

At the time of resetting the amplifier, the reset control signals cx and cz are respectively switched to VCC and VSS. Hence, the transistors 70 and 71 are both turned ON. Hence, the amplifying and latching operations on the input signals in and /in are carried out in the same way as the first embodiment of the present invention.

In a standby mode (power-down mode), the amplifier is in the inactive state in which the sense amplifier activating signals az and ax are respectively equal to VCC and VSS and the transistors 76 and 77 are both OFF. Hence, there is no pass-through current.

According to the second embodiment of the present invention, the latch-type amplifier needs, as control signals necessary to perform the resetting, amplifying and latching operations, needs only the reset control signals cx and cz. Hence, it becomes possible to easily perform the control of the operation timing and accomplish speeding up of the operation of the amplifier.

Further, according to the second embodiment of the present invention, the output nodes n3 and n4 are reset by shortcircuiting the output nodes n3 and n4. Hence, it is possible to reduce the time necessary to reset the amplifier. This also contributes to speeding up the operation of the amplifier.

Furthermore, no pass-through current flows in the standby mode because in the standby mode, the sense amplifier activating signals az and ax are respectively equal to VCC and VSS and the transistors 76 and 77 are both OFF.

Figure 11:
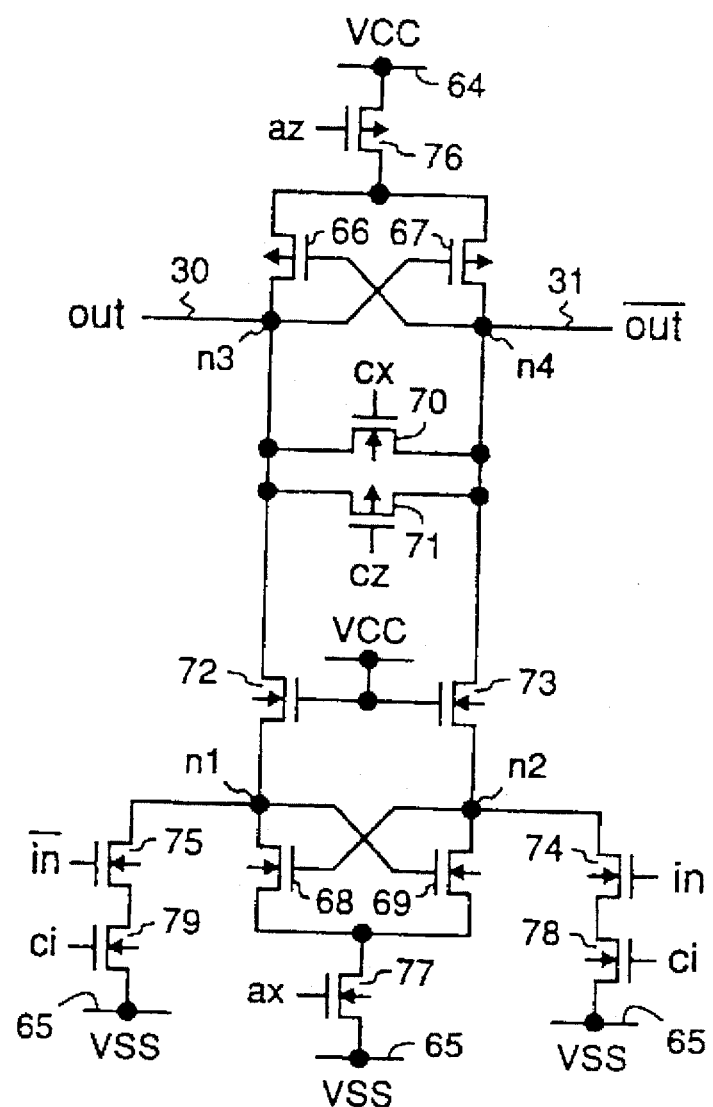
FIG. 11 is a circuit diagram of a latch-type amplifier according to a third embodiment of the present invention.

A description will now be given, with reference to FIGS. 11 and 12, of a latch-type amplifier according to a third embodiment of the present invention. As shown in FIG. 11, nMOS transistors 78 and 79 are added to the configuration shown in FIG. 9. The nMOS transistors 78 and 79 are turned ON and OFF by the input control signal ci. The source of the nMOS transistor 74 is connected to the drain of the nMOS transistor 78, and the source of the nMOS transistor 78 is connected to the VSS ground line 65. The source of the nMOS transistor 75 is connected to the drain of the nMOS transistor 79, and the source of the nMOS transistor 79 is connected to the VSS ground line 65. The other parts of the configuration shown in FIG. 11 are the same as those of the configuration shown in FIG. 9.

Figure 12:
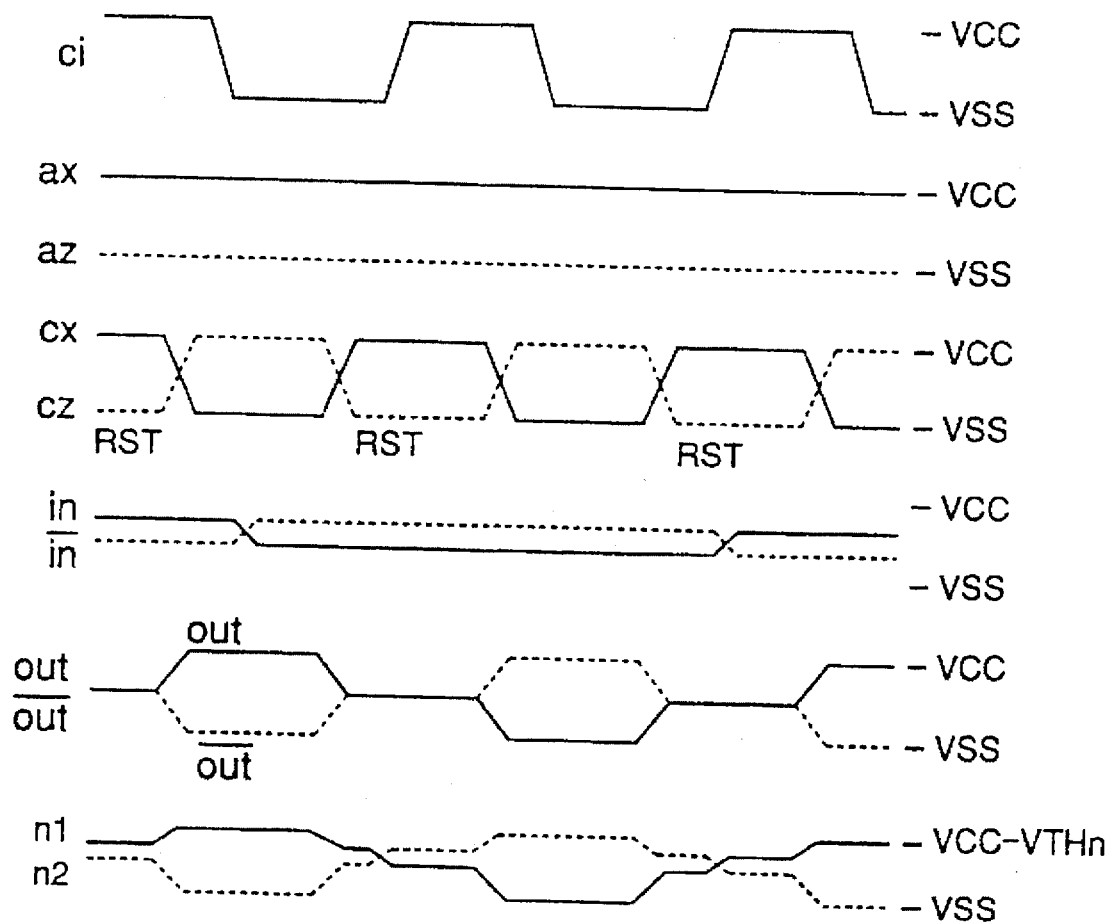
FIG. 12 is a waveform diagram of the operation of the amplifier shown in FIG. 11.

FIG. 12 is a waveform diagram of the operation of the amplifier shown in FIG. 11. The input signals in and /in are amplified and latched, the input control signal ci is set equal to VSS, and the nMOS transistors 78 and 79 are turned OFF. Hence, a drop of the potential of the node n1 or n2 does not occur even if the input signal in becomes lower than the input signal /in.

According to the third embodiment of the present invention, the latch-type amplifier needs, as control signals necessary to perform the resetting, amplifying and latching operations, needs only the reset control signals cx and cz and the input control signal ci. Hence, it becomes possible to easily perform the control of the operation timing and accomplish speeding up of the operation of the amplifier.

Further, according to the second embodiment of the present invention, the output nodes n3 and n4 are reset by shortcircuiting the output nodes n3 and n4. Hence, it is possible to reduce the time necessary to reset the amplifier. This also contributes to speeding up the operation of the amplifier.

Furthermore, no pass-through current flows in the standby mode because in the standby mode, the sense amplifier activating signals az and ax are respectively equal to VCC and VSS and the transistors 76 and 77 are both OFF.

Moreover, when the input signals in and /in are amplified and latched, the input control signal ci is switched to VSS and the nMOS transistors 78 and 79 are turned OFF. Hence, the nMOS transistors 74 and 75 do not allow the pull-down currents to flow therein. Hence, the stability of the operation can be improved.

A description will now be given, with reference to FIGS. 13 and 14, of a latch-type amplifier according to a fourth embodiment of the present invention. The fourth embodiment of the present invention is a variation of the first embodiment thereof.

Figure 13:
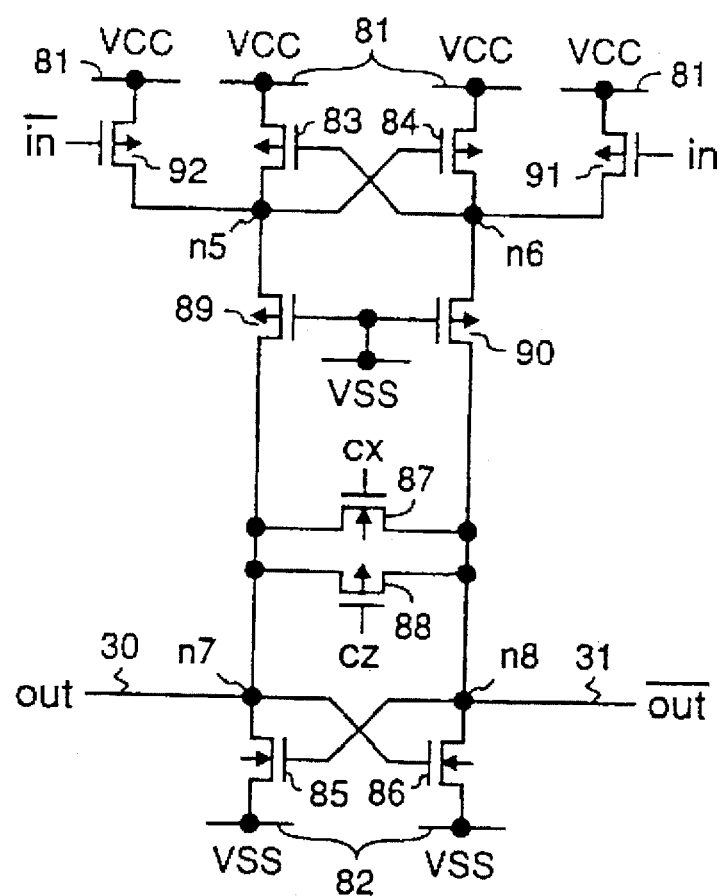
FIG. 13 is a circuit diagram of a latch-type amplifier according to a fourth embodiment of the present invention.

The latch-type amplifier shown in FIG. 13 is connected to a VCC power supply line 81 which supplies the power supply voltage VCC, and a VSS ground line 82 which supplies the ground voltage VSS. The latch-type amplifier includes pMOS transistors 83 and 84, which form a flip-flop circuit. The sources of the pMOS transistors 83 and 84 are connected to the VCC power supply line 81. The gates of the pMOS transistors 83 and 84 are respectively connected to the drains of the pMOS transistors 84 and 83.

The latch-type amplifier shown in FIG. 13 includes nMOS transistors 85 and 86, which form a flip-flop circuit. The sources of the nMOS transistors 85 and 86 are connected to the VSS ground line 82. The gates of the nMOS transistors 85 and 86 are respectively connected to the drains of the nMOS transistors 86 and 85. That is, the nMOS transistors 85 and 86 are cross-coupled.

The latch-type amplifier shown in FIG. 13 includes an nMOS transistor 87, which is turned ON and OFF by the reset control signal cx. The drain of the nMOS transistor 87 is connected to a node n7 at which the drain of the nMOS transistor 85 is connected to the gate of the nMOS transistor 86. The source of the nMOS transistor 87 is connected to a node n8 at which the drain of the nMOS transistor 86 is connected to the gate of the nMOS transistor 85.

The latch-type amplifier shown in FIG. 13 includes a pMOS transistor 88, which is turned ON and OFF by the reset control signal cz having the complementary relationship with the reset control signal cx. The source of the pMOS transistor 88 is connected to the node n7, and the drain thereof is connected to the node n8.

The latch-type amplifier shown in FIG. 13 includes pMOS transistors 89 and 90 having gates to which a reference voltage such as the power supply voltage VSS is applied. The source of the pMOS transistor 89 is connected to the node n5, and the drain thereof is connected to the node n7 at which the drain of the nMOS transistor 85 is connected to the gate of the nMOS transistor 86. The source of the pMOS transistor 90 is connected to the node n6 at which the drain of the pMOS transistor 84 is connected to the gate of the pMOS transistor 83. The drain of the pMOS transistor 90 is connected to the node n8.

The latch-type amplifier shown in FIG. 13 includes a pMOS transistor 91 having a gate supplied with the input signal in. The drain of the pMOS transistor 91 is connected to the node n6, and the source thereof is connected to the VCC power supply line 81. The latch-type amplifier shown in FIG. 13 includes a pMOS transistor having a gate supplied with the input signal /in. The drain of the pMOS transistor 92 is connected to the node n5, and the source thereof is connected to the VCC power supply line 81. The node n7 functions as an output terminal via which the output signal out is output. The node n8 function as another output terminal via which the output signal /out is output.

Figure 14:
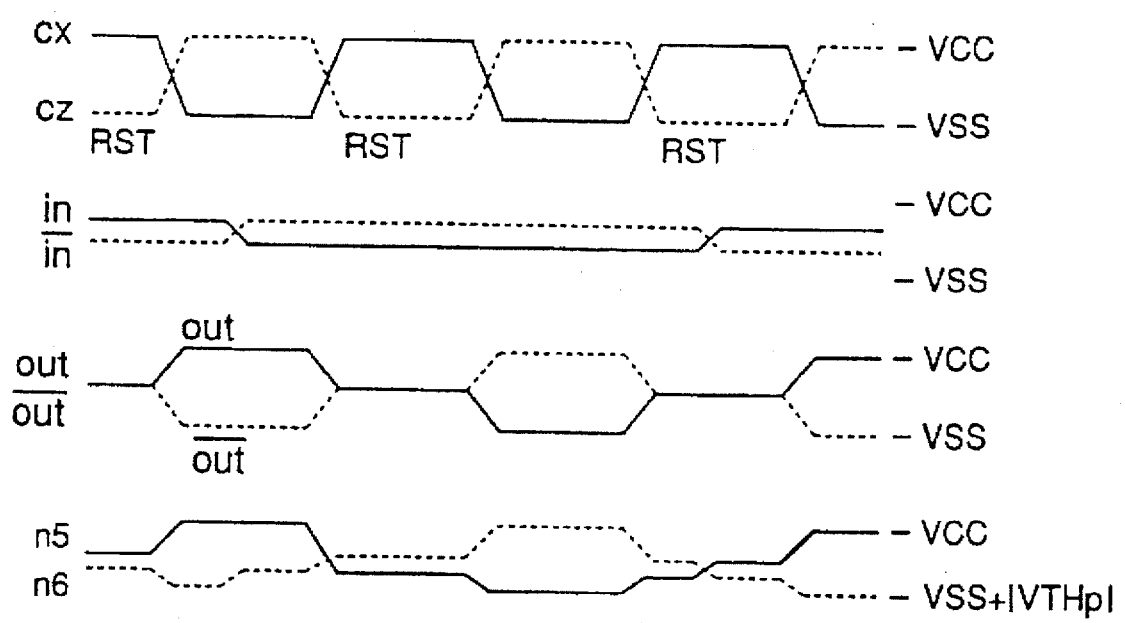
FIG. 14 is a waveform diagram of the operation of the amplifier shown in FIG. 13.

FIG. 14 is a waveform diagram of the operation of the latch-type amplifier shown in FIG. 13. At the time of resetting the amplifier, the reset control signals cx and cz are respectively set equal to VCC and VSS. Hence, the nMOS transistor 87 and the pMOS transistor 88 are both turned ON, and the output nodes n7 and n8 are shortcircuited. Hence, the potentials of the output nodes n7 and n8 are reset to VCC/2 rapidly. In this case, the pMOS transistors 89 and 90 function as source-follower circuits. The nodes n5 and n6 are reset to approximately VCC/2. When the potential of the input signal in is higher than that of the input signal /in, the current flowing in the pMOS transistor 92 is greater than that flowing in the pMOS transistor 91. Hence, a slight potential difference equal to, for example, 0.1 V–0.3 V is generated between the nodes n5 and n6. Hence, the potential of the node n5 becomes higher than that of the node n6.

That is, in the above case, the flip-flop circuit made up of the pMOS transistors 83 and 84 is in a state in which the flip-flop circuit is about to start the amplifying operation. However, the output nodes n7 and n8 are shortcircuited, and the pMOS transistors 85 and 86 are in the diode-connected state. In this state, the flip-flop circuit is not configured and the amplifying operation is not carried out.

Then, the reset control signals cx and cz are respectively set equal to VSS and VCC, and thus the nMOS transistor 87 and the pMOS transistor 88 are both turned OFF. As a result, the output nodes n7 and n8 are released from the shortcircuited state.

If the potential of the input signal in is higher than that of the input signal /in and the potential of the node n5 is higher than that of the node n6, the potential of the node n5 is increased toward the voltage VCC due to the amplifying function of the flip-flop circuit made up of the pMOS transistors 83 and 84. Hence, the potential of the output node n7 is also increased toward the power supply voltage VCC, and the pull-down operation of the nMOS transistor 86 becomes stronger. Hence, the potential of the output node n8 is decreased toward the ground voltage VCC. Finally, the potentials of the output signals out and /out become equal to VCC and VSS, respectively. Further, the potential of the node n5 becomes equal to VCC, and the potential of the node n6 becomes equal to VSS+|VTHp| where VTHp denotes threshold voltages of the pMOS transistors 89 and 90.

Since the potential of the output node n6 is equal to VSS+|VTHp| and the potential of the output node n8 is equal to VSS, the pMOS transistor 90 has a relatively large transfer resistance. Therefore, even if the potential of the input signal /in becomes higher than that of the input signal in in the next access, a pull-up current which pulls up the potential of the output node n8 is much smaller than an ON current flowing in the nMOS transistor 86. Hence, an increase in the potential of the node n6 is simply about 0.1 V, and does not affect the potential of the output node n8, that is, the potential of the output signal /out.

In the above case, since the potential of the node n5 is equal to VCC, the pMOS transistor 89 is deeply ON. Hence, the state in which the potential of the node n7 is equal to VCC can be maintained even if the potential of the input signal /in becomes higher than that of the input signal in.

As described above, according to the fourth embodiment of the present invention, it is possible to amplify and latch the input signals in and /in without disconnecting the nMOS transistors 91 and 92 receiving the input signals in and /in from the nodes n6 and n5, respectively. As a result, the latch-type amplifier according to the fourth embodiment of the present invention needs, as control signals necessary to perform the resetting, amplifying and latching operations, only the reset control signals cx and cz. Hence, it becomes possible to easily perform the control of the operation timing and accomplish speeding up of the operation of the amplifier.

Further, according to the fourth embodiment of the present invention, the output nodes n7 and n8 are reset by shortcircuiting the output nodes n7 and n8. Hence, it is possible to reduce the time necessary to reset the amplifier. This also contributes to speeding up the operation of the amplifier.

Figure 15:
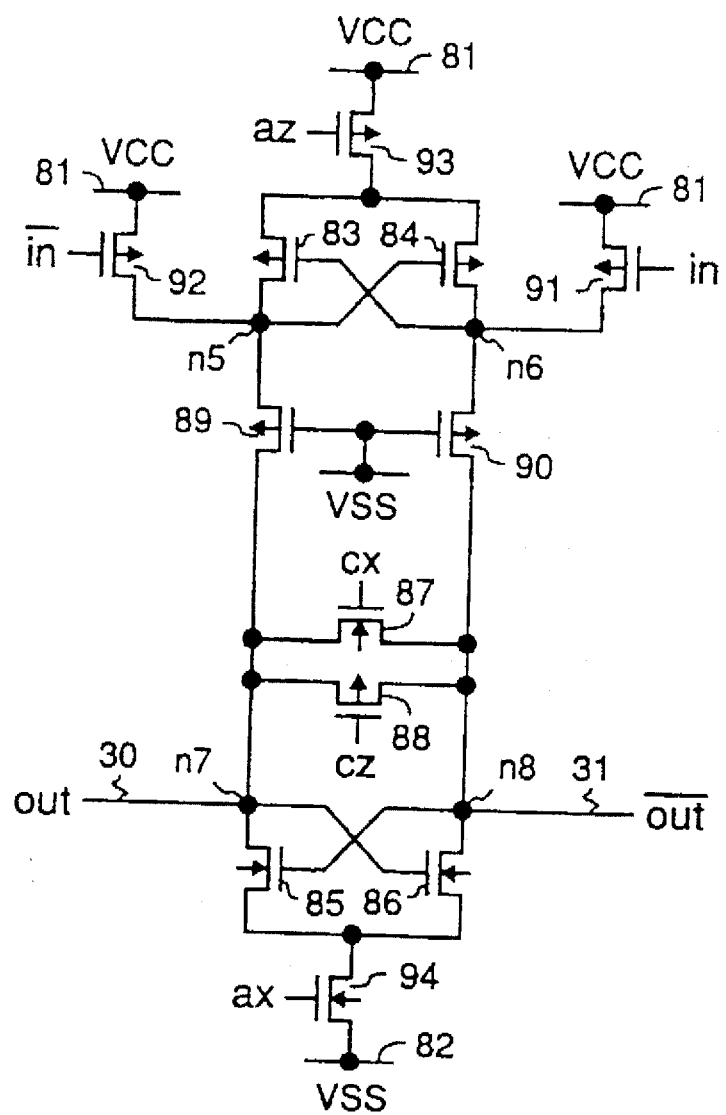
FIG. 15 is a circuit diagram of a latch-type amplifier according to a fifth embodiment of the present invention.

A description will now be given, with reference to FIGS. 15 and 16, of a latch-type amplifier according to a fifth embodiment of the present invention. As shown in FIG. 15, a pMOS transistor 93 and an nMOS transistor 94, which are respectively turned ON/OFF in response to the sense amplifier activating signals az and ax, are added to the configuration shown in FIG. 13 configured according to the fourth embodiment of the present invention. The sources of the pMOS transistors 83 and 84 are connected to the drain of the pMOS transistor 93, and the source of the pMOS transistor 93 is connected to the VCC power supply line 81. The sources of the nMOS transistors 85 and 86 are connected to the drain of the nMOS transistor 94, and the source of the nMOS transistor 94 is connected to the VSS ground line 82. The other parts of the configuration shown in FIG. 15 are the same as those of the configuration shown in FIG. 13.

Figure 16:
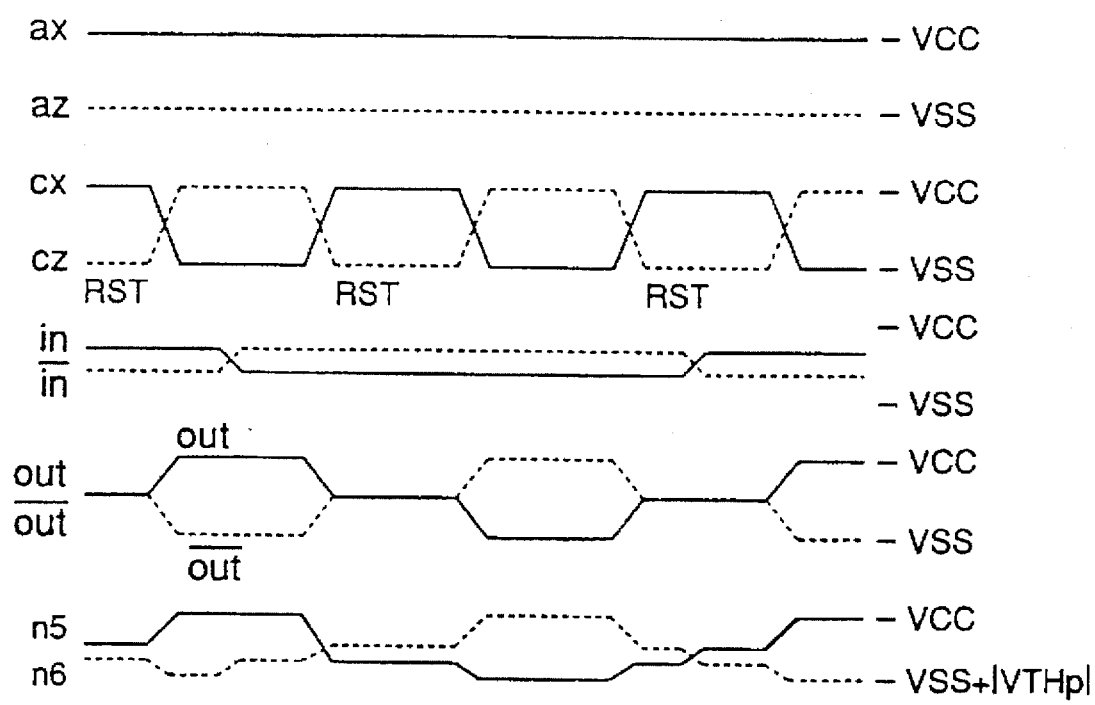
FIG. 16 is a waveform diagram of the operation of the amplifier shown in FIG. 15.

FIG. 16 is a waveform diagram of the operation of the amplifier shown in FIG. 15. In the active mode in which the amplifier is in the active state, the sense amplifier activating signals az and ax are respectively equal to VSS and VCC, and the transistors 93 and 94 are both ON.

At the time of resetting the amplifier, the reset control signals cx and cz are respectively switched to VCC and VSS. Hence, the transistors 87 and 88 are both turned ON. Hence, the amplifying and latching operations on the input signals in and /in are carried out in the same way as the fourth embodiment of the present invention.

In the standby mode (power-saving mode), the amplifier is in the inactive state in which the sense amplifier activating signals az and ax are respectively equal to VCC and VSS and the transistors 93 and 94 are both OFF. Hence, there is no pass-through current.

According to the fifth embodiment of the present invention, the latch-type amplifier needs, as control signals necessary to perform the resetting, amplifying and latching operations, needs only the reset control signals cx and cz. Hence, it becomes possible to easily perform the control of the operation timing and accomplish speeding up of the operation of the amplifier.

Further, according to the fifth embodiment of the present invention, the output nodes n7 and n8 are reset by shortcircuiting the output nodes n7 and n8. Hence, it is possible to reduce the time necessary to reset the amplifier. This also contributes to speeding up the operation of the amplifier.

Furthermore, no pass-through current flows in the standby mode because in the standby mode, the sense amplifier activating signals az and ax are respectively equal to VCC and VSS and the transistors 93 and 94 are both OFF.

Figure 17:
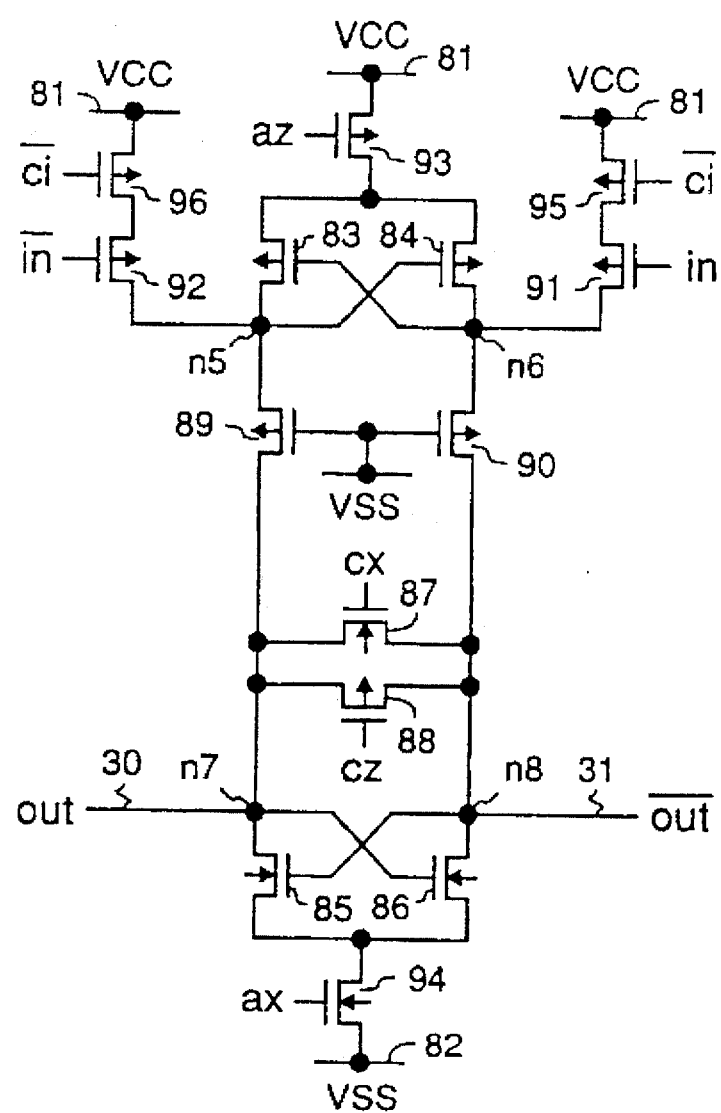
FIG. 17 is a circuit diagram of a latch-type amplifier according to a sixth embodiment of the present invention.

A description will now be given, with reference to FIGS. 17 and 18, of a latch-type amplifier according to a sixth embodiment of the present invention. As shown in FIG. 17, pMOS transistors 95 and 96 are added to the configuration shown in FIG. 15. The pMOS transistors 95 and 96 are turned ON and OFF by the input control signal /ci. The source of the pMOS transistor 91 is connected to the drain of the pMOS transistor 95, and the source of the pMOS transistor 95 is connected to the VCC power supply line 81. The source of the pMOS transistor 92 is connected to the drain of the pMOS transistor 96, and the source of the pMOS transistor 96 is connected to the VCC power supply line 81. The other parts of the configuration shown in FIG. 17 are the same as those of the configuration shown in FIG. 15.

Figure 18:
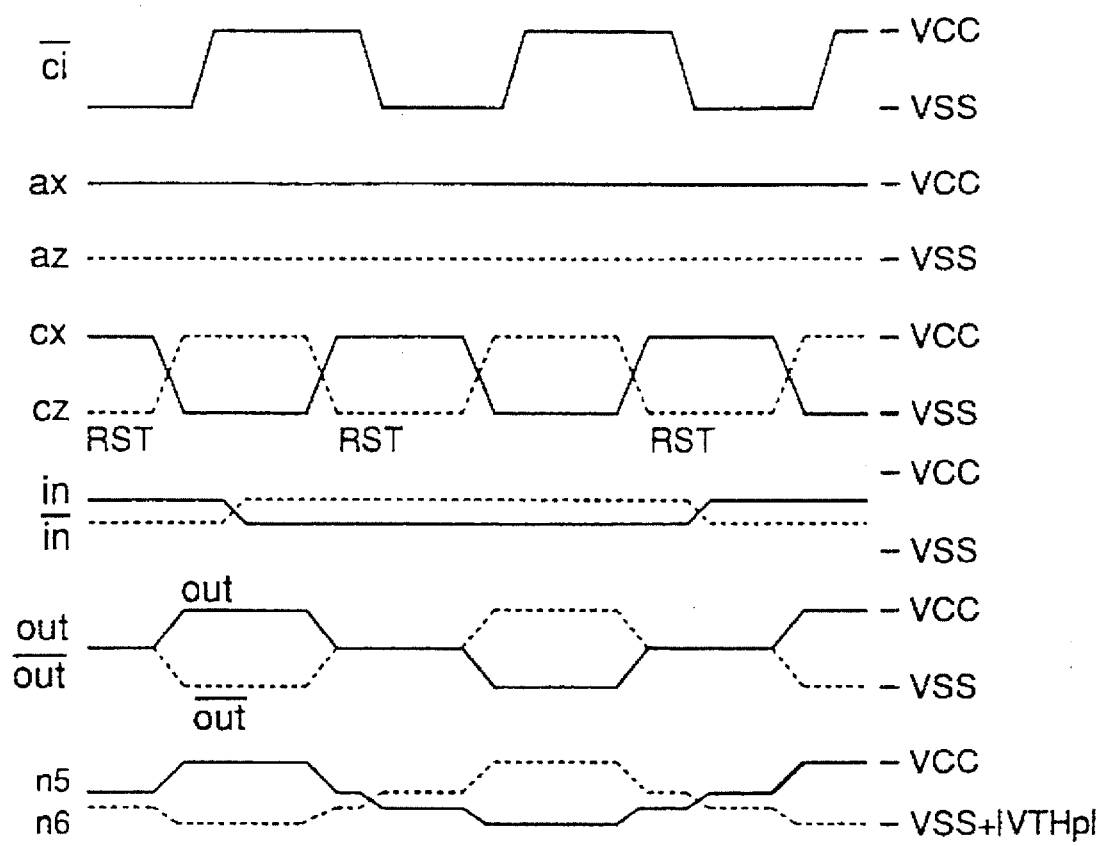
FIG. 18 is a waveform diagram of the operation of the amplifier shown in FIG. 17.

FIG. 18 is a waveform diagram of the operation of the amplifier shown in FIG. 17. The input signals in and /in are amplified and latched, the input control signal /ci is set equal to VCC, and the pMOS transistors 95 and 96 are turned OFF. Hence, an increase in the potential of the node n5 or n6 does not occur even if the input signal in becomes lower than the input signal /in.

According to the sixth embodiment of the present invention, the latch-type amplifier needs, as control signals necessary to perform the resetting, amplifying and latching operations, only the reset control signals cx and cz and the input control signal /ci. Hence, it becomes possible to easily perform the control of the operation timing and accomplish speeding up of the operation of the amplifier.

Further, according to the sixth embodiment of the present invention, the output nodes n7 and n8 are reset by shortcircuiting the output nodes n7 and n8. Hence, it is possible to reduce the time necessary to reset the amplifier. This also contributes to speeding up the operation of the amplifier.

Furthermore, no pass-through current flows in the standby mode because in the standby mode, the sense amplifier activating signals az and ax are respectively equal to VCC and VSS and the transistors 93 and 94 are both OFF.

Moreover, when the input signals in and /in are amplified and latched, the input control signal /ci is switched to VCC and the pMOS transistors 95 and 96 are turned OFF. Hence, the pMOS transistors 91 and 92 do not allow the pull-up currents to flow therein. Hence, the stability of the operation can be improved.

A description will now be given, with reference to FIGS. 19 and 20, of a latch-type amplifier according to a seventh embodiment of the present invention, which corresponds to a combination of the first and fourth embodiments thereof.

Figure 19:
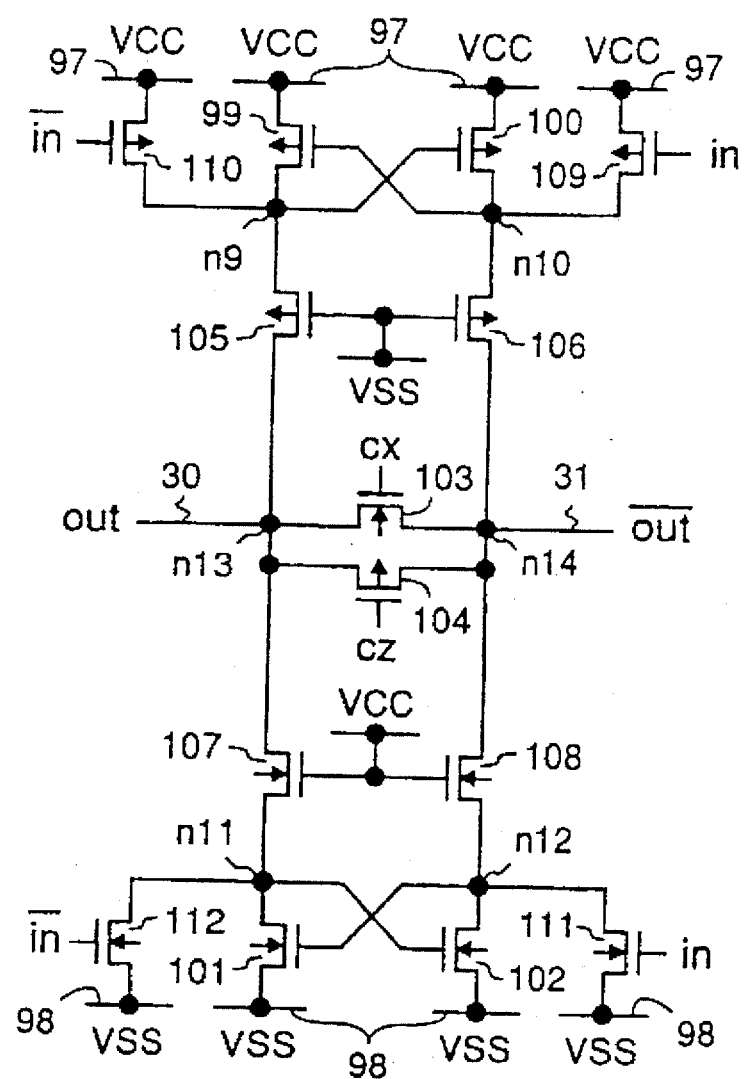
FIG. 19 is a circuit diagram of a latch-type amplifier according to a seventh embodiment of the present invention.

The latch-type amplifier shown in FIG. 19 is connected to a VCC power supply line 97 which supplies the power supply voltage VCC, and a VSS ground line 98 which supplies the ground voltage VSS. The latch-type amplifier includes pMOS transistors 99 and 100, which form a flip-flop circuit. The sources of the pMOS transistors 99 and 100 are connected to the VCC power supply line 97. The gates of the pMOS transistors 99 and 100 are respectively connected to the drains of the pMOS transistors 100 and 99.

The latch-type amplifier shown in FIG. 19 includes nMOS transistors 101 and 102, which form a flip-flop circuit. The sources of the nMOS transistors 101 and 102 are connected to the VSS ground line 98. The gates of the nMOS transistors 101 and 102 are respectively connected to the drains of the nMOS transistors 102 and 101. That is, the nMOS transistors 101 and 102 are cross-coupled.

The latch-type amplifier shown in FIG. 19 includes an nMOS transistor 103, which is turned ON and OFF by the reset control signal cx. The drain of the nMOS transistor 103 is connected to an output node n13, and the source thereof is connected to an output node n14. The amplifier includes a pMOS transistor 104, which is turned ON and OFF by the reset control signal /cx. The source of the transistor 104 is connected to the node n13 and the drain thereof is connected to the node n14.

The latch-type amplifier shown in FIG. 19 includes pMOS transistors 105 and 106 having gates to which a reference voltage such as the power supply voltage VSS is applied. The source of the pMOS transistor 105 is connected to the node n9, and the drain thereof is connected to the node n13. The source of the pMOS transistor 106 is connected to the node n10 at which the drain of the pMOS transistor 100 is connected to the gate of the pMOS transistor 99. The drain of the pMOS transistor 106 is connected to the node n14.

The amplifier shown in FIG. 19 includes nMOS transistors 107 and 108 having gates supplied, as a reference voltage, with the power supply voltage VCC. The drain of the nMOS transistor 107 is connected to the output node n13, and the source thereof is connected to the node n11 at which the drain of the nMOS transistor 101 is connected to the gate of the nMOS transistor 102. The drain of the nMOS transistor 108 is connected to the output node n14, and the source thereof is connected to the node n12 at which the drain of the nMOS transistor 102 is connected to the gate of the nMOS transistor 101.

The latch-type amplifier shown in FIG. 19 includes a pMOS transistor 109 having a gate supplied with the input signal in. The drain of the pMOS transistor 91 is connected to the node n10, and the source thereof is connected to the VCC line 97. The latch-type amplifier shown in FIG. 19 includes a pMOS transistor 110 having a gate supplied with the input signal /in. The drain of the pMOS transistor 110 is connected to the node n9, and the source thereof is connected to the VCC line 97. The amplifier shown in FIG. 19 includes an nMOS transistor 111 having a gate supplied with the input signal in. The drain of the transistor 111 is connected to the node n12 and the source thereof is connected to the VSS ground line 98. The amplifier includes an nMOS transistor 112 having a gate supplied with the input signal /in. The drain of the transistor 112 is connected to the node n11, and the source thereof is connected to the VSS ground line 98.

Figure 20:
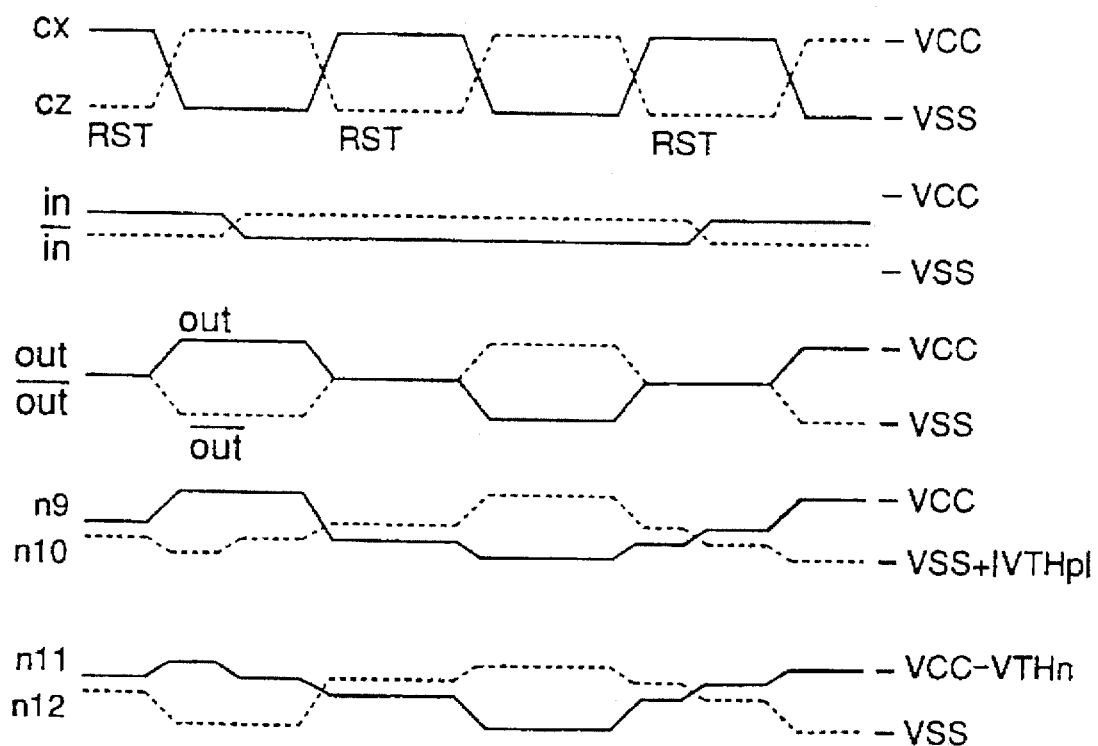
FIG. 20 is a waveform diagram of the operation of the amplifier shown in FIG. 19.

FIG. 20 is a waveform diagram of the operation of the latch-type amplifier shown in FIG. 19. When the amplifier is reset, the reset control signals cx and cz are respectively set to VCC and VSS. Hence, the transistors 103 and 104 are both turned ON, and the output nodes n13 and n14 are shortcircuited. Hence, the potentials of the output nodes n13 and n14 are reset to VCC/2 rapidly.

In this case, the pMOS transistors 105 and 106 function as a source-follower circuit, and the nodes n9 and n10 are reset to approximately VCC/2. When the potential of the input signal in is higher than that of the input signal /in, the current flowing in the pMOS transistor 110 becomes greater than that flowing in the pMOS transistor 109. Hence, a slight potential difference equal to, for example, 0.1 V–0.3 V occurs between the nodes n9 and n10, and the potential of the node n9 is higher than that of the node n10. That is, in this case, the flip-flop circuit made up of the pMOS transistors 99 and 100 is in a state in which the flip-flop circuit is about to start the amplifying operation. However, the output nodes n13 and n14 are shortcircuited, and thus the amplifying operation is not carried out.

In this case, the nMOS transistors 107 and 108 function as a source-follower circuit, and the nodes n11 and n12 are reset to approximately VCC/2. When the potential of the input signal in is higher than that of the input signal /in, the current flowing in the nMOS transistor 111 is greater than that flowing in the nMOS transistor 112. Hence, a slight potential difference equal to, for example, 0.1 V–0.3 V occurs between the nodes n11 and n12, and the potential of the node n11 is higher than that of the node n12. That is, in this case, the flip-flop circuit made up of the nMOS transistors 101 and 102 is in a state in which the flip-flop circuit is about to start the amplifying operation. However, the output nodes n13 and n14 are shortcircuited, and thus the amplifying operation is not carried out.

Then, the reset control signals cx and cz are respectively set equal to VSS and VCC, and thus the nMOS transistor 103 and the pMOS transistor 104 are both turned OFF. As a result, the output nodes n13 and n14 are released from the shortcircuited state.

When the potential of the input signal in is higher than that of the input signal /in and the potential of the node n9 is higher than that of the node n10, the potential of the node n9 is increased toward the voltage VCC due to the amplifying function of the flip-flop circuit made up of the pMOS transistors 99 and 100. At that occasion, the potential of the node n12 is lower than that of node n11. Due to the amplifying function of the flip-flop circuit made up of the nMOS transistors 101 and 102, the potential of the node n12 is decreased toward the ground voltage VSS. Hence, the potential of the node n11 is increased toward the power supply voltage VCC−VTHn, while the potential of the node n10 is decreased toward the ground voltage VSS+|VTHp|. Finally, the potentials of the output signals out and /out become equal to VCC and VSS, respectively. Further, the potential of the node n9 becomes equal to VCC, and the potential of the node n10 becomes equal to VSS+|VTHp| where VTHp denotes threshold voltages of the pMOS transistors 105 and 106.

Since the potential of the output node n10 is equal to VSS+|VTHp| and the potential of the output node n14 is equal to VSS, the pMOS transistor 106 has a relatively large transfer resistance. Therefore, even if the potential of the input signal /in becomes higher than that of the input signal in in the next access, a pull-up current which pulls up the potential of the output node n14 is much less than an ON current flowing in the nMOS transistors 102 and 108. Hence, an increase in the potential of the node n10 is simply about 0.1 V, and does not affect the potential of the output node n14, that is, the potential of the output signal /out.

In the above case, since the potential of the node n9 is equal to VCC, the pMOS transistor 105 is deeply ON. Hence, the state in which the potential of the node n9 is equal to VCC can be maintained even if the potential of the input signal /in becomes higher than that of the input signal in. Further, the potential of the output node n13 is equal to VCC and the potential of the node n11 is equal to VCC−VTHn, and therefore the nMOS transistor 107 has a large transfer resistance. Hence, even if the potential of the input signal in is lower than that of the input signal /in, the pull-down current which pulls down the potential of the output node n13 is very small as compared with the ON current flowing in the pMOS transistors 99 and 105. Hence, the drop of the potential of the node n9 is simply about 0.1 V, and does not affect the potential of the output node n13, that is, the potential of the output signal out.

In the above case, since the potential of the node n14 is equal to VSS, the nMOS transistor 108 is deeply ON. Hence, the state in which the potential of the node n14 is equal to VSS can be maintained even if the potential of the input signal /in becomes higher than that of the input signal in.

As described above, according to the seventh embodiment of the present invention, it is possible to amplify and latch the input signals in and /in without respectively disconnecting the pMOS transistors 109 and 110 receiving the input signals in and /in from the nodes n10 and n9 and respectively disconnecting the nMOS transistors 111 and 112 receiving the input signals in and /in from the nodes n12 and n11. In other words, the latch-type amplifier according to the seventh embodiment of the present invention needs, as control signals necessary to perform the resetting, amplifying and latching operations, only the reset control signals cx and cz. Hence, it becomes possible to easily perform the control of the operation timing and accomplish speeding up of the operation of the amplifier.

Further, according to the seventh embodiment of the present invention, the output nodes n13 and n14 are reset by shortcircuiting the output nodes n13 and n14. Hence, it is possible to reduce the time necessary to reset the amplifier. This also contributes to speeding up the operation of the amplifier.

Figure 21:
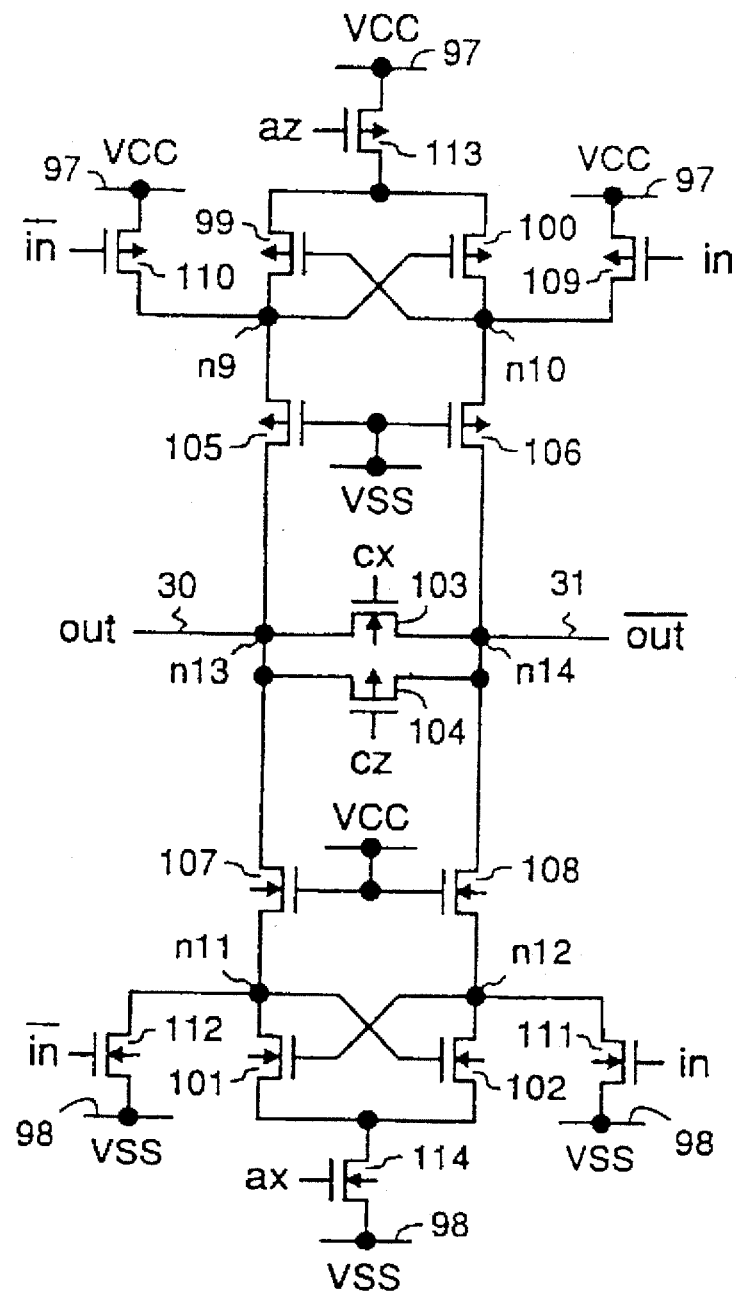
FIG. 21 is a circuit diagram of a latch-type amplifier according to an eighth embodiment of the present invention.

A description will now be given, with reference to FIGS. 21 and 22, of a latch-type amplifier according to an eighth embodiment of the present invention. As shown in FIG. 21, a pMOS transistor 113 and an nMOS transistor 114, which are respectively turned ON/OFF in response to the sense amplifier activating signals az and ax, are added to the configuration shown in FIG. 19 configured according to the seventh embodiment of the present invention. The sources of the pMOS transistors 99 and 100 are connected to the drain of the pMOS transistor 113, and the source of the pMOS transistor 113 is connected to the VCC power supply line 97. The sources of the nMOS transistors 101 and 102 are connected to the drain of the nMOS transistor 114, and the source of the nMOS transistor 114 is connected to the VSS ground line 98. The other parts of the configuration shown in FIG. 21 are the same as those of the configuration shown in FIG. 19.

Figure 22:
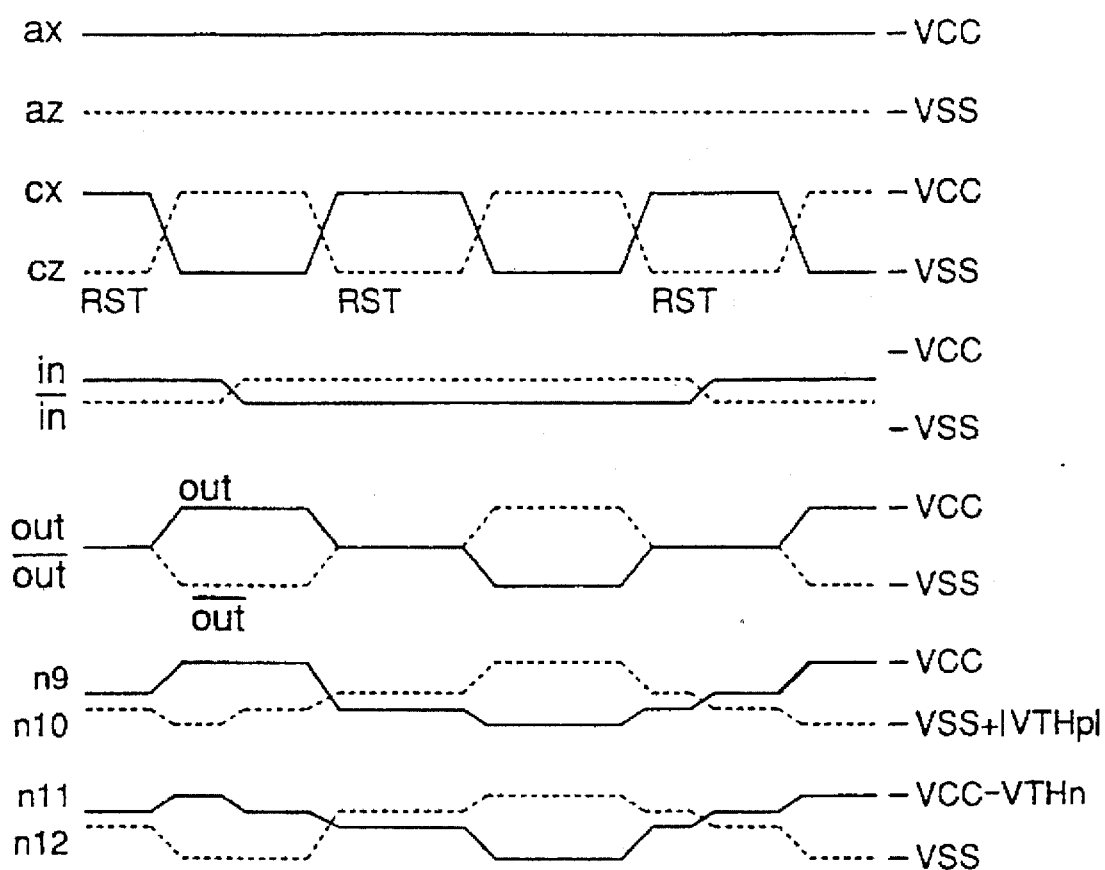
FIG. 22 is a waveform diagram of the operation of the amplifier shown in FIG. 21.

FIG. 22 is a waveform diagram of the operation of the amplifier shown in FIG. 21. In the active mode in which the amplifier is in the active state, the sense amplifier activating signals az and ax are respectively equal to VSS and VCC, and the transistors 113 and 114 are both ON.

At the time of resetting the amplifier, the reset control signals cx and cz are respectively switched to VCC and VSS. Hence, the transistors 103 and 104 are both turned ON. Hence, the amplifying and latching operations on the input signals in and /in are carried out in the same way as the seventh embodiment of the present invention.

In the standby mode (power saving mode), the amplifier is in the inactive state in which the sense amplifier activating signals az and ax are respectively equal to VCC and VSS and the transistors 113 and 114 are both OFF. Hence, there is no pass-through current.

According to the eighth embodiment of the present invention, the latch-type amplifier needs, as control signals necessary to perform the resetting, amplifying and latching operations, only the reset control signals cx and cz. Hence, it becomes possible to easily perform the control of the operation timing and accomplish speeding up of the operation of the amplifier.

Further, according to the eighth embodiment of the present invention, the output nodes n13 and n14 are reset by shortcircuiting the output nodes n13 and n14. Hence, it is possible to reduce the time necessary to reset the amplifier. This also contributes to speeding up the operation of the amplifier.

Furthermore, no pass-through current flows in the standby mode because in the standby mode, the sense amplifier activating signals az and ax are respectively equal to VCC and VSS and the transistors 113 and 114 are both OFF.

Figure 23:
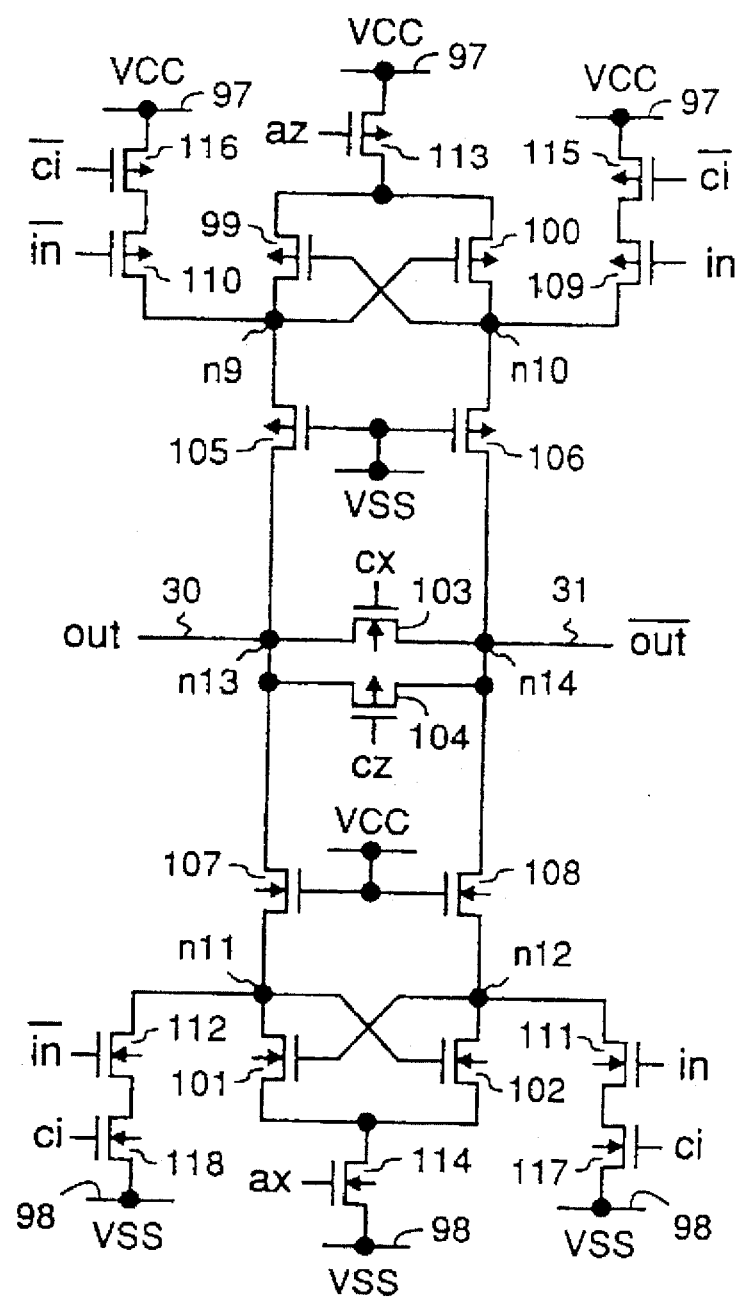
FIG. 23 is a circuit diagram of a latch-type amplifier according to a ninth embodiment of the present invention.

A description will now be given, with reference to FIGS. 23 and 24, of a latch-type amplifier according to a ninth embodiment of the present invention. As shown in FIG. 23, pMOS transistors 115 and 116 are added to the configuration shown in FIG. 21. The pMOS transistors 115 and 116 are turned ON and OFF by the input control signal /ci. The source of the pMOS transistor 109 is connected to the drain of the pMOS transistor 115, and the source of the pMOS transistor 115 is connected to the VCC line 97. The source of the pMOS transistor 110 is connected to the drain of the pMOS transistor 116, and the source of the pMOS transistor 116 is connected to the VCC line 97. Further, nMOS transistors 117 and 118 are provided which are turned ON and OFF by the input control signal ci having the complementary relationship with the input control signal /ci. The source of the nMOS transistor 111 is connected to the drain of the nMOS transistor 117, and the source of the transistor 117 is connected to the VSS ground line 98. The source of the nMOS transistor 112 is connected to the drain of the nMOS transistor 118, and the source of the nMOS transistor 118 is connected to the VSS ground line 98.

Figure 24:
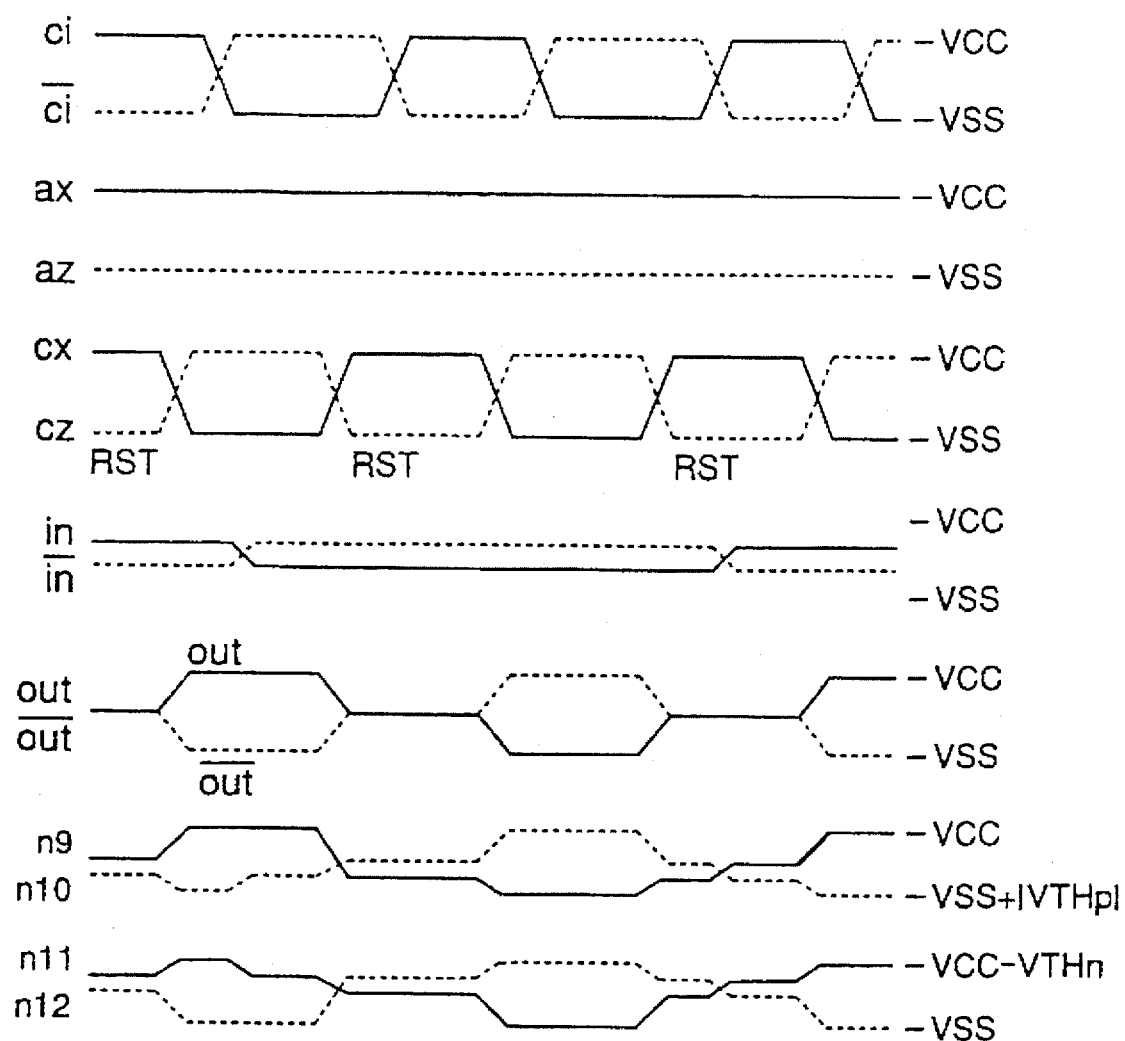
FIG. 24 is a waveform diagram of the operation of the amplifier shown in FIG. 23.

FIG. 24 is a waveform diagram of the operation of the amplifier shown in FIG. 23. The input signals in and /in are amplified and latched, the input control signal /ci is set equal to VCC, and the pMOS transistors 115 and 116 are turned OFF. Further, the nMOS transistors 117 and 118 are turned OFF. Hence, an increase in the potential of the node n9 or n10 and a decrease in the potential of the node n11 or n12 does not occur even if the input signal in becomes lower than the input signal /in.

According to the ninth embodiment of the present invention, the latch-type amplifier needs, as control signals necessary to perform the resetting, amplifying and latching operations, needs only the reset control signals cx and cz and the input control signals /ci and ci. Hence, it becomes possible to easily perform the control of the operation timing and accomplish speeding up of the operation of the amplifier.

Further, according to the ninth embodiment of the present invention, the output nodes n13 and n14 are reset by shortcircuiting the output nodes n13 and n14. Hence, it is possible to reduce the time necessary to reset the amplifier. This also contributes to speeding up the operation of the amplifier.

Furthermore, no pass-through current flows in the standby mode because in the standby mode, the sense amplifier activating signals az and ax are respectively equal to VCC and VSS and /ci and ci are respectively equal to VCC and VSS, and the transistors 113, 114 115, 116, 117 and 118 are all OFF.

Moreover, when the input signals in and /in are amplified and latched, the input control signal /ci is switched to VCC and the pMOS transistors 115 and 116 are turned OFF, and the input control signal ci is switched to VSS and the nMOS transistors 117 and 118 are turned OFF. Hence, the pMOS transistors 109 and 110 and the nMOS transistors 111 and 112 are switched to the inactive state. Hence, the stability of the operation can be improved.

The latch-type amplifier described above is suitable for a sense amplifier of a semiconductor memory device such as an SRAM.

The present invention is not limited to the specifically disclosed embodiments, and variations and modifications may be made without departing from the scope of the present invention.

What is claimed is:

1. An amplifier coupled to first and second power supply lines, said amplifier comprising:

a first pair of cross-coupled transistors having sources commonly connected to the first power supply line and drains respectively connected to a pair of output terminals;

a second pair of cross-coupled transistors having sources commonly connected to the second power supply line and drains respectively receiving a pair of input signals;

a reset circuit provided between the pair of output terminals and shortcircuits the pair of output terminals in response to a pair of predetermined control signals; and a pair of non-linear elements which are provided between the first and second pairs of cross-coupled transistors.

2. The amplifier as claimed in claim 1, wherein said pair of non-linear elements are respectively nMOS transistors which have current terminals connecting the first and second pairs of cross-coupled transistors and gates connected to the first power supply line.

3. The amplifier as claimed in claim 1, further comprising:

a first transistor which disconnects the sources of the first pair of cross-coupled transistors from the first power supply line in response to a first activating signal; and a second transistor which disconnects the sources of the second pair of cross-coupled transistors from the second power supply line in response to a second activating signal.

4. The amplifier as claimed in claim 3, further comprising:

a pair of input transistors having drains coupled to the drains of the second pair of cross-coupled transistors, sources coupled to the second power supply lines, and gates receiving the pair of input signals;

a third transistor which is provided between one of the pair of input transistors and the second power supply line and is controlled in response to a first input control signal; and a fourth transistor which is provided between the other one of the pair of input transistors and the second power supply line and is controlled in response to a second input control signal.

5. The amplifier as claimed in claim 4, wherein the third and fourth transistors are respectively nMOS transistors.

6. The amplifier as claimed in any of claims 1 to 5, wherein:

the first pair of cross-coupled transistors are respectively pMOS transistors;

the second pair of cross-coupled transistors are respectively nMOS transistors; and the pair of input transistors are respectively nMOS transistors.

7. The amplifier as claimed in claim 6, wherein the pair of non-linear elements is located between the reset circuit and the second pair of cross-coupled transistors.

8. An amplifier coupled to first and second power supply lines, said amplifier comprising:

a first pair of cross-coupled transistors having sources commonly connected to the first power supply line and drains respectively receiving a pair of input signals;

a second pair of cross-coupled transistors having sources connected to the second power supply line and drains respectively connected to a pair of output terminals;

a reset circuit provided between the pair of output terminals and shortcircuits the pair of output terminals in response to a pair of predetermined control signals; and a pair of non-linear elements which are provided between the first and second pairs of cross-coupled transistors.

9. The amplifier as claimed in claim 8, wherein said pair of non-linear elements are respectively pMOS transistors which have current terminals connecting the first and second pairs of cross-coupled transistors and gates are connected to the second power supply line.

10. The amplifier as claimed in claim 8, further comprising:

a first transistor which disconnects the sources of the first pair of cross-coupled transistors from the first power supply line in response to a first activating signal; and a second transistor which disconnects the the sources of the second pair of cross-coupled transistors from the second power supply line in response to a second activating signal.

11. The amplifier as claimed in claim 10, further comprising:

a pair of input transistors having sources connected to the first power supply line, drains connected to the drains of the first pair of cross-coupled transistors, and gates receiving the pair of input signals;

a third transistor which is provided between the first power supply line and one of the pair of input transistors and is controlled in response to a first input control signal; and a fourth transistor which is provided between the first power supply line and the other one of the pair of input transistors and is controlled in response to a second input control signal.

12. The amplifier as claimed in claim 11, wherein the third and fourth transistors are respectively pMOS transistors.

13. The amplifier as claimed in any of claims 8 to 12, wherein:

the first pair of cross-coupled transistors are respectively pMOS transistors;

the second pair of cross-coupled transistors are respectively nMOS transistors; and the pair of input transistors are respectively pMOS transistors.

14. An amplifier coupled to first and second power supply lines, said amplifier comprising:

a first pair of cross-coupled transistors having sources commonly connected to the first power supply line and drains respectively receiving a pair of input signals;

a second pair of cross-coupled transistors having sources commonly connected to the second power supply line and drains respectively receiving the pair of input signals;

a reset circuit provided between a pair of output terminals and shortcircuits the pair of output terminals in response to a pair of predetermined control signals;

a first pair of non-linear elements provided between the pair of output terminals and the first pair of cross-coupled transistors;

a second pair of non-linear elements provided between the pair of output terminals and the second pair of cross-coupled transistors.

15. The amplifier as claimed in claim 14, wherein:

the first pair of non-linear elements are pMOS transistors having current terminals connecting the drains of the first pair of cross-coupled transistors and the pair of output terminals, and gates connected to the second power supply line; and the second pair of non-linear elements are nMOS transistors having current terminals connecting the drains of the second pair of cross-coupled transistors and the pair of output terminals, and gates connected to the first power supply line.

16. The amplifier as claimed in claim 14, further comprising:

a first transistor which disconnects the sources of the first pair of cross-coupled transistors from the first power supply line in response to a first activating signal; and a second transistor which disconnects the sources of the second pair of cross-coupled transistors from the second power supply line in response to a second activating signal.

17. The amplifier as claimed in claim 16, further comprising:

a first pair of input transistors having sources coupled to the first power supply line, drains connected to the drains of the first pair of cross-coupled transistors, and gates receiving the pair of input signals;

a third transistor which is provided between the first power supply line and one of the first pair of input transistors and is controlled in response to a first input control signal;

a fourth transistor which is provided between the first power supply line and the other one of the first pair of input transistors and is controlled in response to a second input control signal;

a second pair of input transistors having drains connected to the drains of the second pair of cross-coupled transistors, sources coupled to the second power supply lines, and gates receiving the pair of input signals;

a fifth transistor which is provided between one of the second pair of input transistors and the second power supply line and is controlled in response to the second input control signal; and a sixth transistor which is provided between the other one of the second pair of input transistors and the second power supply line and is controlled in response to the first input control signal.

18. A semiconductor memory device comprising:

a plurality of cells; and a sense amplifier commonly connected to said plurality of cells, said sense amplifier being coupled to first and second power supply lines and comprising:

a first pair of cross-coupled transistors having sources commonly connected to the first power supply line and drains respectively connected to a pair of output terminals;

a second pair of cross-coupled transistors having sources commonly connected to the second power supply line and drains respectively receiving a pair of input signals;

a reset circuit provided between the pair of output terminals and shortcircuits the pair of output terminals in response to a pair of predetermined control signals; and a pair of non-linear elements which are provided between the first and second pairs of cross-coupled transistors.

19. A semiconductor memory device comprising:

a plurality of cells; and a sense amplifier commonly connected to said plurality of cells, said sense amplifier being coupled to first and second power supply lines and comprising:

a first pair of cross-coupled transistors having sources commonly connected to the first power supply line and drains respectively receiving a pair of input signals;

a second pair of cross-coupled transistors having sources connected to the second power supply line and drains respectively connected to a pair of output terminals;

a reset circuit provided between the pair of output terminals and shortcircuits the pair of output terminals in response to a pair of predetermined control signals; and a pair of non-linear elements which are provided between the first and second pairs of cross-coupled transistors.

20. A semiconductor memory device comprising:

a plurality of cells; and a sense amplifier commonly connected to said plurality of cells, said sense amplifier being coupled to first and second power supply lines and comprising:

a first pair of cross-coupled transistors having sources commonly connected to the first power supply line and drains respectively receiving a pair of input signals;

a second pair of cross-coupled transistors having sources commonly connected to the second power supply line and drains respectively receiving the pair of input signals;

a reset circuit provided between a pair of output terminals and shortcircuits the pair of output terminals in response to a pair of predetermined control signals;

a first pair of non-linear elements provided between the pair of output terminals and the first pair of cross-coupled transistors;

a second pair of non-linear elements provided between the pair of output terminals and the second pair of cross-coupled transistors.

* * * * *